(12) United States Patent
Nagatomo et al.

(10) Patent No.: US 11,049,730 B2
(45) Date of Patent: Jun. 29, 2021

(54) WORKPIECE PROCESSING METHOD

(71) Applicant: Tokyo Electron Limited, Tokyo (JP)

(72) Inventors: Yu Nagatomo, Shanghai (CN);
Takahiko Kato, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/375,071

(22) Filed: Apr. 4, 2019

(65) Prior Publication Data

US 2019/0311915 A1 Oct. 10, 2019

(30) Foreign Application Priority Data

Apr. 5, 2018 (JP) .............................. JP2018-073189

(51) Int. Cl.
*H01L 21/3213* (2006.01)
*H01L 21/66* (2006.01)
*H01L 21/67* (2006.01)
*H01J 37/32* (2006.01)

(52) U.S. Cl.
CPC .. *H01L 21/32136* (2013.01); *H01J 37/32834* (2013.01); *H01L 21/32139* (2013.01); *H01L 21/67069* (2013.01); *H01L 21/67253* (2013.01); *H01L 22/26* (2013.01); *H01J 2237/332* (2013.01); *H01J 2237/334* (2013.01)

(58) Field of Classification Search
CPC ........... H01J 37/32834; H01J 2237/334; H01J 2237/332; H01L 22/26; H01L 21/67253; H01L 21/32139; H01L 21/67069; H01L 21/32136; H01L 21/32051; H01L 21/02164; H01L 21/0228
See application file for complete search history.

(56) References Cited

U.S. PATENT DOCUMENTS

| | | | |
|---|---|---|---|
| 2002/0132394 A1* | 9/2002 | Ku | ................... H01L 21/28114 438/142 |
| 2012/0231561 A1* | 9/2012 | Dolan | ............... H01L 21/02071 438/14 |
| 2018/0323276 A1* | 11/2018 | Kang | ................. H01L 21/02337 |
| 2019/0103363 A1* | 4/2019 | Yu | ..................... H01L 21/28568 |

FOREIGN PATENT DOCUMENTS

JP 08-078396 A 3/1996

* cited by examiner

*Primary Examiner* — Thanh T Nguyen
(74) *Attorney, Agent, or Firm* — Abelman, Frayne & Schwab

(57) ABSTRACT

A method of processing a workpiece includes: forming a ruthenium film on the workpiece and disposing a mask on the ruthenium film; etching the ruthenium film through a plasma processing; forming a protective film on the workpiece through an atomic layer deposition method, the protective film including a first region extending along a side wall surface of the mask and a second region extending over the ruthenium film; and etching the protective film so as to remove the second region while leaving the first region. The etching the ruthenium film includes a first step of etching the ruthenium film through a plasma processing using an oxygen-containing gas, and a second step of etching the ruthenium film through a plasma processing using a chlorine-containing gas. The first step and the second step are alternately performed.

14 Claims, 17 Drawing Sheets

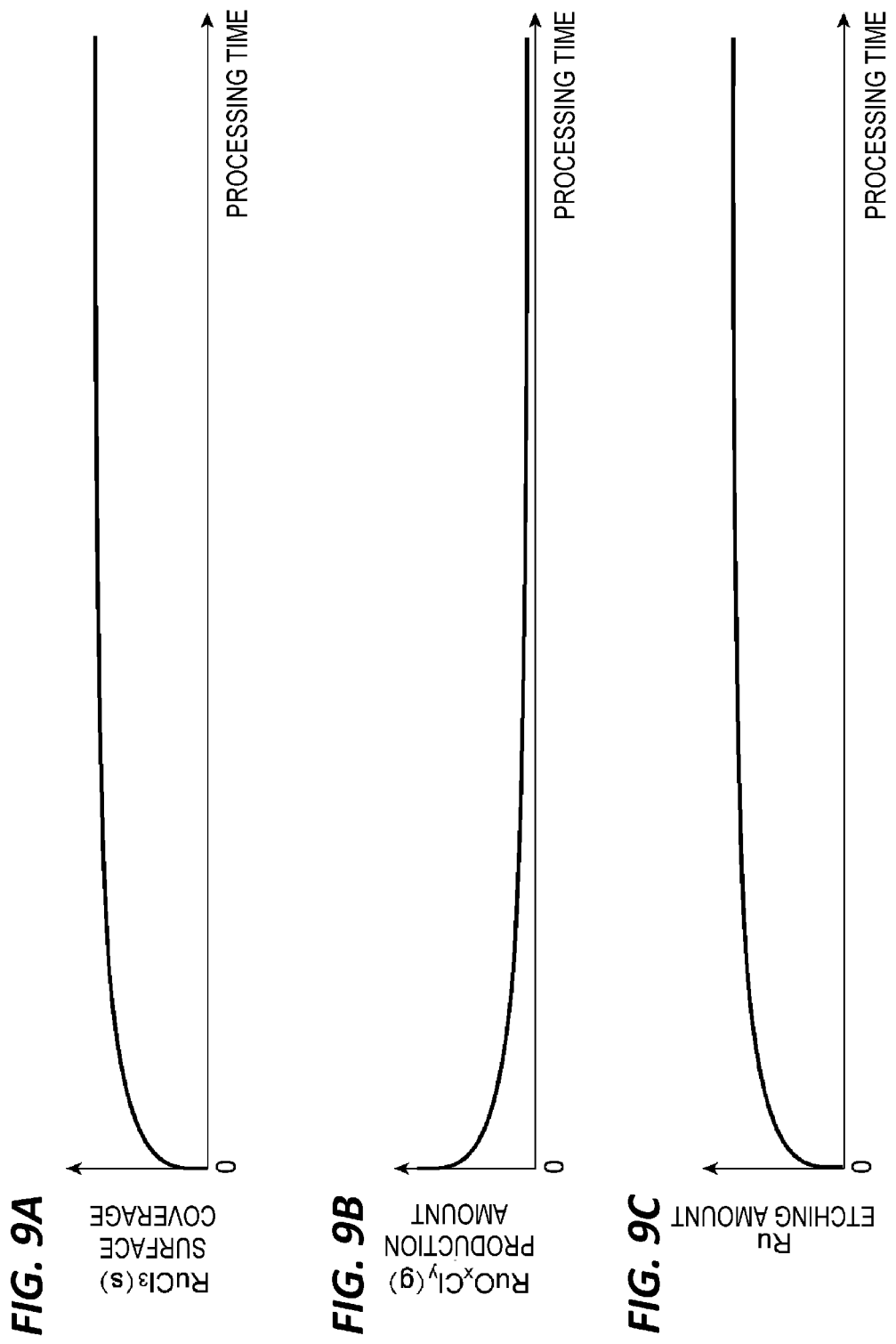

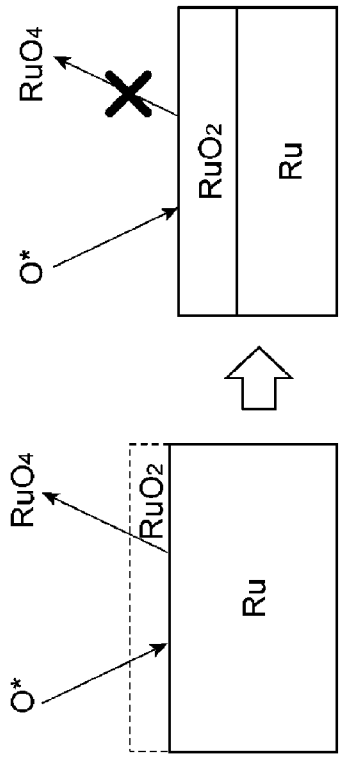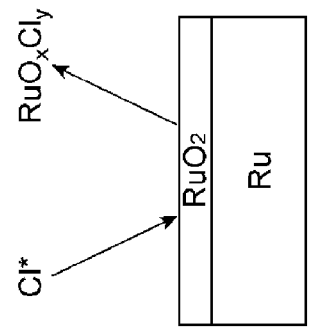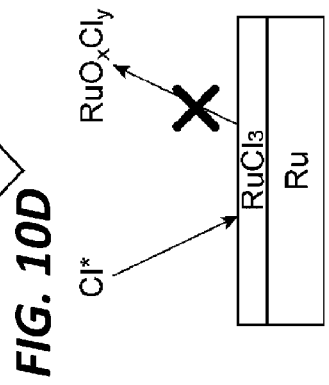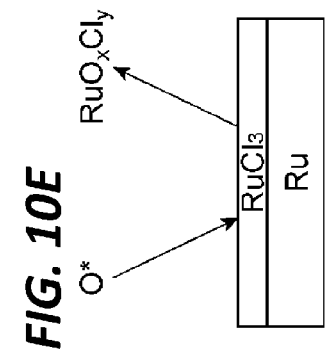

WORKPIECE PROCESSING METHOD

CROSS-REFERENCE TO RELATED APPLICATIONS

This application is based on and claims priority from Japanese Patent Application No. 2018-073189, filed on Apr. 5, 2018 with the Japan Patent Office, the disclosure of which is incorporated herein in its entirety by reference.

TECHNICAL FIELD

The present disclosure relates to a method of processing a workpiece.

BACKGROUND

In the manufacture of an electronic device, a processing of etching a ruthenium film formed of ruthenium (Ru) may be performed in some cases. Patent Document 1 discloses a method of etching a workpiece having a ruthenium film and a mask made of silicon oxide ($SiO_2$) formed on the ruthenium film. In this method, a ruthenium film is etched using plasma of a mixed gas containing oxygen ($O_2$) and chlorine ($Cl_2$). See, for example, Japanese Patent Laid-open Publication No. 08-078396.

SUMMARY

In an aspect, a method of processing a workpiece disclosed herein includes forming a ruthenium film on the workpiece and disposing a mask on the ruthenium film; etching the ruthenium film through a plasma processing; forming a protective film on the workpiece through an atomic layer deposition method; and etching the protective film. The protective film includes a first region extending along a side wall surface of the mask and a second region extending over the ruthenium film. In the etching the protective film, the protective film is etched so as to remove the second region while leaving the first region. The etching the ruthenium film includes a first step and a second step. In the first step, the ruthenium film is etched through a plasma processing using an oxygen-containing gas. In the second step, the ruthenium film is etched through a plasma processing using a chlorine-containing gas. The first step and the second step are alternately performed.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 9A is a graph illustrating a relationship between a processing time and a surface coverage of a nonvolatile chloride in plasma etching performed using a chlorine-containing gas. FIG. 9B is a graph illustrating a relationship between a processing time and a generation amount of a volatile chloride in plasma etching performed using a chlorine-containing gas. FIG. 9C is a graph illustrating a relationship between a processing time and an etching amount of Ru in plasma etching performed using a chlorine-containing gas.

FIGS. 10A to 10E are conceptual views for explaining an etching principle.

DETAILED DESCRIPTION

Figure 1:
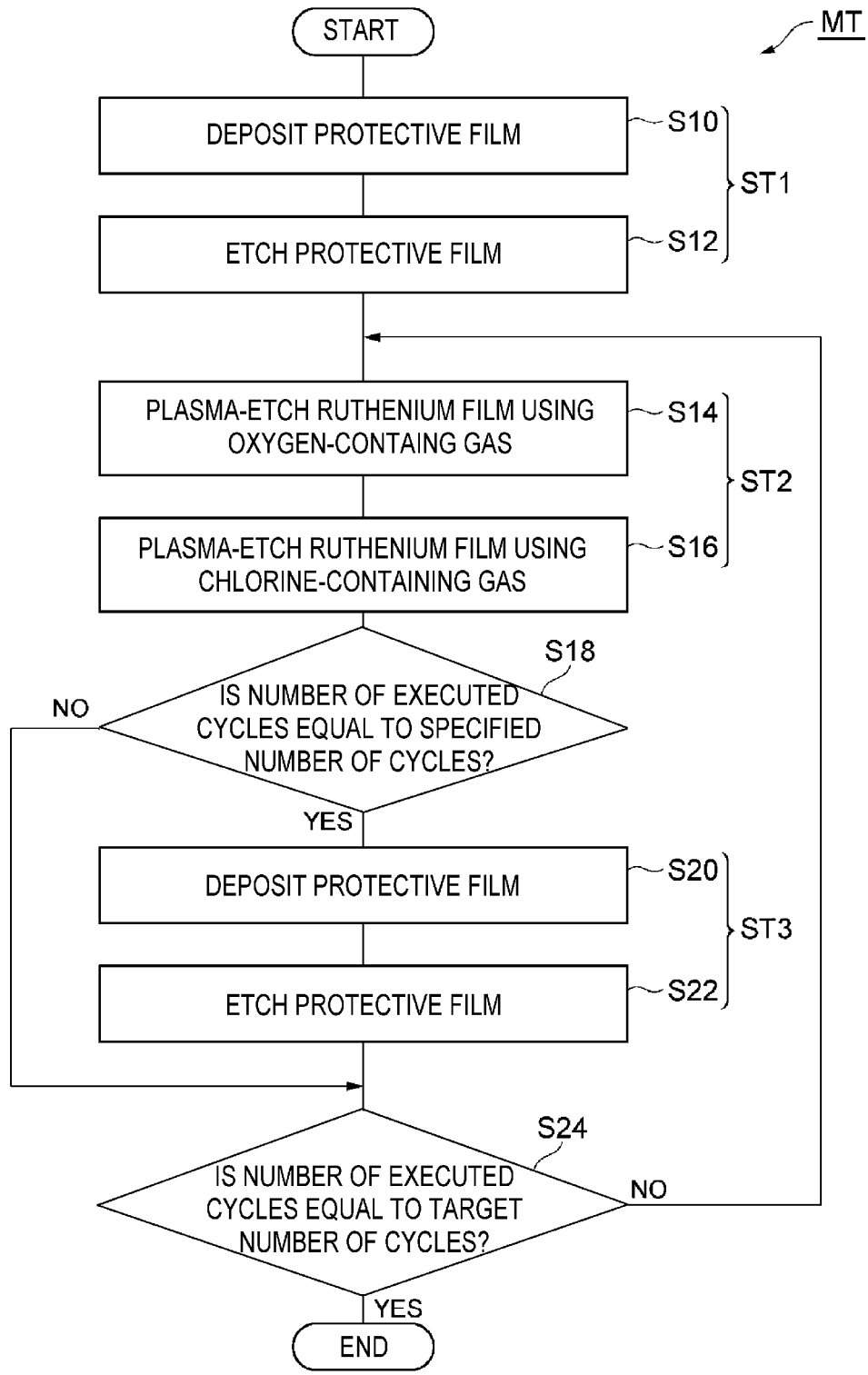
FIG. 1 is a flowchart illustrating a processing method according to an embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In an aspect, a method of processing a workpiece includes forming a ruthenium film on the workpiece and disposing a mask on the ruthenium film; etching the ruthenium film through a plasma processing; a step of forming a protective film on the workpiece through an atomic layer deposition method; and etching the protective film. The protective film includes a first region extending along a side wall surface of the mask and a second region extending over the ruthenium film. In the etching the protective film, the protective film is etched so as to remove the second region while leaving the first region. The etching the ruthenium film includes a first step and a second step. In the first step, the ruthenium film is etched through a plasma processing using an oxygen-containing gas. In the second step, the ruthenium film is etched through a plasma processing using a chlorine-containing gas. The first step and the second step are alternately performed.

According to this processing method, since the oxygen-containing gas and the chlorine-containing gas are alternately used to etch the ruthenium film, it is possible to avoid that the etching rate depends on the plasma distribution of a mixed gas. Therefore, this processing method is able to suppress in-plane variations in etching rate. In addition, according to this processing method, a protective film is formed on the surface of the mask and the ruthenium film through an atomic layer deposition method. Then, the protective film is etched so as to leave the first region. This makes it possible to compensate, by the protective film, for the shape change of the mask caused due to etching. In addition, since the first region of the protective film is provided along the side wall surface of the mask, a stronger mask for the plasma etching of the ruthenium film is provided. Therefore, this processing method is able to suppress variations in the shape of the ruthenium film in the in-plane direction.

In an embodiment, the protective film may be a film selected from a group consisting of a metal film, an oxide film, a nitride film, and an organic film. In this case, the protective film may be formed through an atomic layer deposition method.

In an embodiment, the forming the protective film may include performing a plurality of cycles each of which includes supplying a precursor gas and generating plasma. In the supplying the precursor gas, a precursor gas containing a raw material is supplied in order to deposit a precursor containing the raw material of the protective film on the workpiece. In the generating the plasma, plasma is generated in order to supply active species to the precursor on the workpiece. In this case, by repeatedly executing the deposition of the precursor and the reaction between the precursor and the active species, the protective film is formed on the mask and the surface of the ruthenium film.

In an embodiment, the processing method may include acquiring in-plane distribution data of mask dimensions, and determining a target temperature at each position on the workpiece. In the determining the target temperature, based on a relationship between the deposition amount of the protective film and the temperature of the workpiece, which is acquired in advance, and the in-plane distribution data of the dimensions of the mask, the target temperature at each position on the workpiece is determined such that the dimensions of the mask become designed values. In the forming the protective film, the temperature distribution of the workpiece is controlled such that the determined target temperature is acquired at each position on the determined workpiece.

The deposition amount of the protective film realized by the deposition of the precursor and the reaction between the precursor and the active species varies depending on the increase or decrease in the temperature of the workpiece. That is, it is possible to change the deposition rate of the protective film for each in-plane position using the temperature of the workpiece as a parameter. Therefore, according to this processing method, it is possible not only to suppress a variation in the shape of the ruthenium film caused due to the shape change of the mask caused due to etching, but also to suppress a variation in the shape of the ruthenium film caused due to the initial shape of the mask.

In an embodiment, the processing method may include a step of acquiring in-plane distribution data of the thickness of the ruthenium, and a step of determining a target temperature at each position on the workpiece. In the determining step, a target temperature at each position on the workpiece is determined such that the thickness of the ruthenium film becomes flat, based on a relationship between an etching amount per cycle in which the first step and the second step are included as one set and a temperature of the workpiece and a processing time of each step, which is acquired in advance, the in-plane distribution data of the thickness of the ruthenium film. The target processing time in the first step is equal to or shorter than a processing time in which a reaction between ruthenium and oxygen is saturated, and/or the target processing time in the second step is equal to or shorter than a processing time in which a reaction between ruthenium and chlorine is saturated. In the first step and the second step, the temperature distribution of the workpiece is controlled such that the determined target temperature at each position on the workpiece is acquired.

When the target processing time of the first step is set to be equal to or less than the processing time in which the reaction between ruthenium and oxygen is saturated and/or the target processing time of the second step is set to be equal to or less than the processing time in which the reaction between ruthenium and chlorine is saturated, the etching amount per cycle varies depending on the increase or decrease of the temperature of the workpiece and the processing time of each process. That is, by determining the target processing time of each step within the above range, it is possible to change the etching rate of the ruthenium film for each in-plane position using the temperature of the workpiece as a parameter. Therefore, according to this processing method, it is possible not only to keep the in-plane uniformity of the etching rate favorably, but also to suppress the deterioration of the in-plane uniformity of the residual film thickness caused after etching due to the nonuniform initial film thickness of the ruthenium film.

Hereinafter, various embodiments will be described in detail with reference to the accompanying drawings. In each drawing, the same or corresponding components will be denoted by the same reference numerals.

<Outline of Processing Method>

Figure 2:
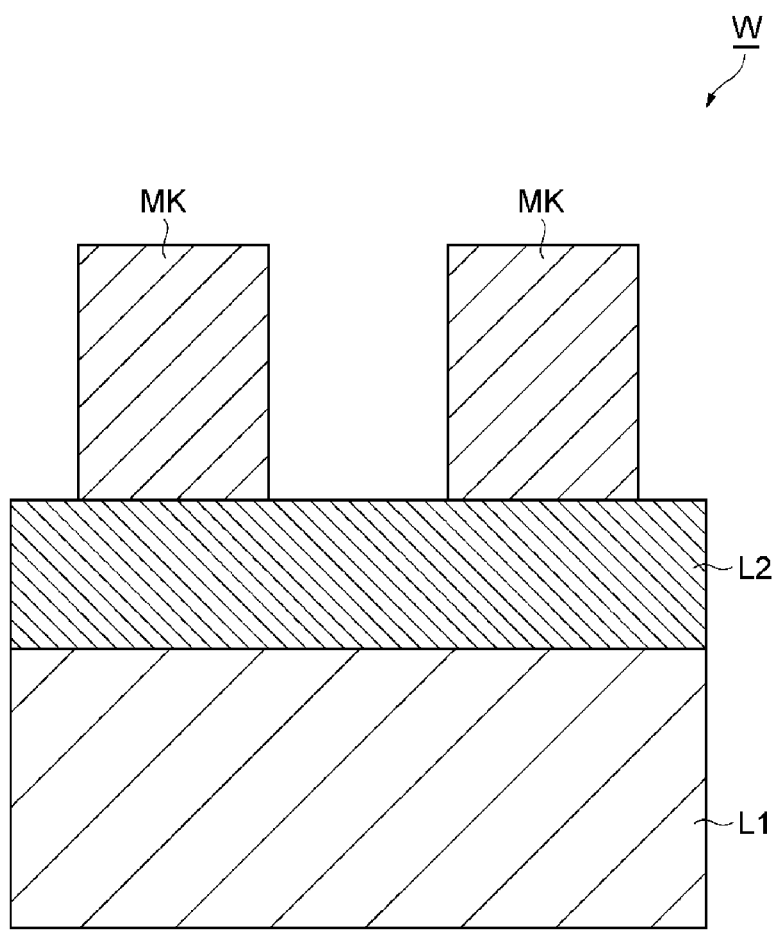
FIG. 2 is a cross-sectional view of an exemplary workpiece to which the processing method shown in FIG. 1 may be applied.

FIG. 1 is a flowchart illustrating a processing method according to an embodiment. The processing method illustrated in FIG. 1 (hereinafter referred to as a "method MT") is performed to etch a ruthenium film. The ruthenium film is a film formed of ruthenium. FIG. 2 is a cross-sectional view of an exemplary workpiece to which method MT is applicable. The workpiece illustrated in FIG. 2 (hereinafter referred to as a "wafer W") has a ruthenium film L2. The ruthenium film L2 is a film to be etched. The ruthenium film L2 is formed on an underlayer L1 as an example.

The wafer W further includes a mask MK. The mask MK is provided on the ruthenium film L2. The mask MK is formed from a material containing carbon as an example. The mask MK is not particularly limited as long as the selection ratio with the ruthenium film L2 is large. The mask MK partially exposes the surface of the ruthenium film L2. In the method MT, the pattern of the mask MK is transferred to the ruthenium film L2 by etching with plasma.

Figure 3:
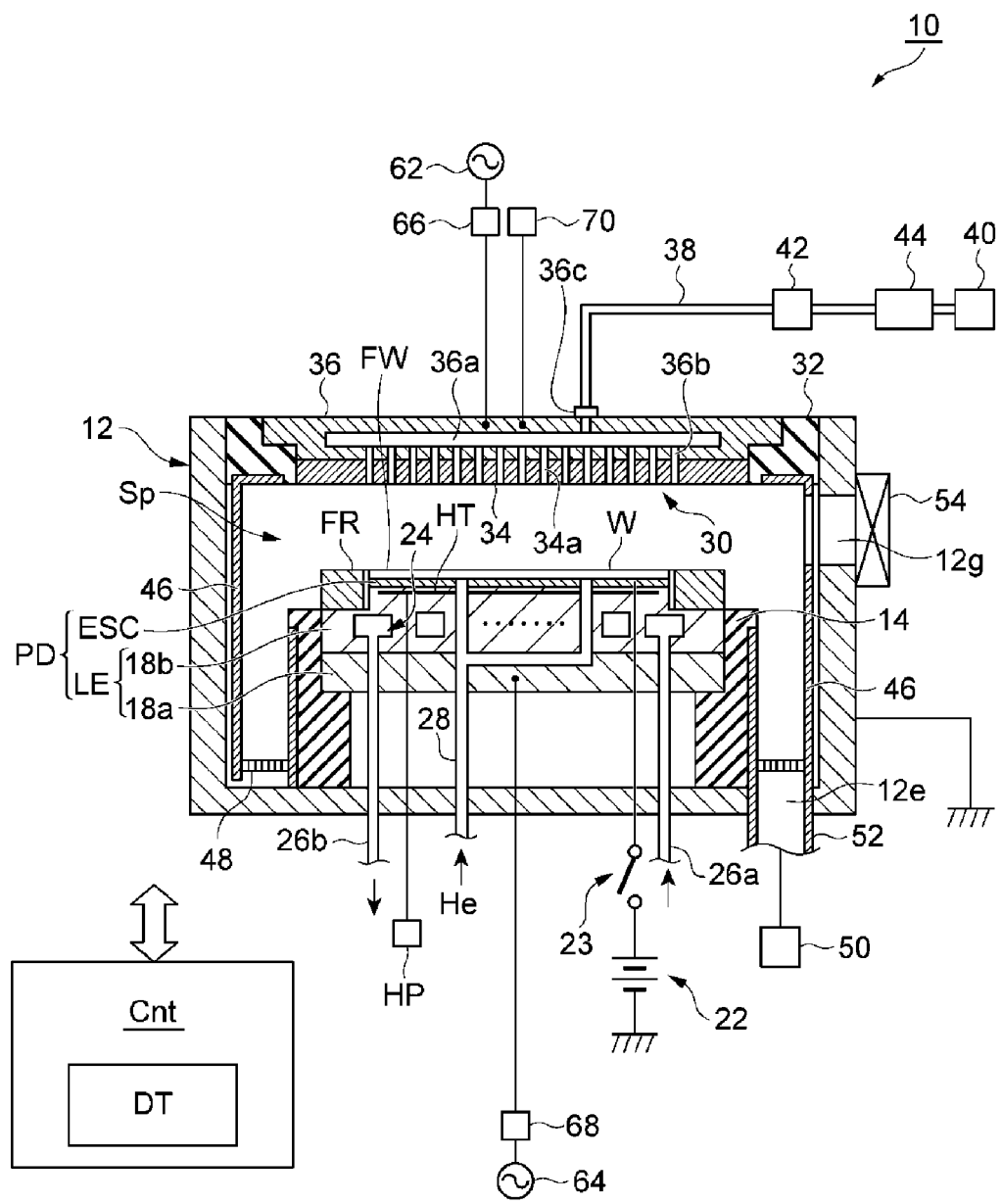
FIG. 3 is a view exemplifying a plasma processing apparatus that is capable of being used to execute the processing method illustrated in FIG. 1.

For carrying out the method MT, a plasma processing apparatus is used. FIG. 3 is a view schematically illustrating an exemplary plasma processing apparatus that is capable of being used to execute the method MT. As illustrated in FIG. 3, the plasma processing apparatus 10 is a plasma etching apparatus including electrodes of parallel flat plates, and is provided with a processing container 12. The processing container 12 has a substantially cylindrical shape, and defines a processing space Sp. The processing container 12 is made of, for example, aluminum, and the inner wall surface thereof is subjected to an anodizing treatment. The processing container 12 is securely grounded.

On the bottom portion of the processing container 12, a substantially cylindrical support unit 14 is provided. The support unit 14 is made of, for example, an insulating material. The insulating material constituting the support unit 14 may contain oxygen, like quartz. The support unit 14 extends in a vertical direction from the bottom portion of the processing container 12 in the processing container 12. A pedestal PD is provided in the processing container 12. The pedestal PD is supported by the support unit 14.

The pedestal PD holds a wafer W on the upper surface thereof. The main surface FW of the wafer W is on the opposite side of the rear surface of the wafer W which is in contact with the upper surface of the pedestal PD. The main surface FW of the wafer W faces an upper electrode 30. The pedestal PD includes a lower electrode LE and an electrostatic chuck ESC. The lower electrode LE includes a first plate 18a and a second plate 18b. The first plate 18a and the second plate 18b are made of a metal such as, for example aluminum, and have a substantially disc shape. The second plate 18b is provided on the first plate 18a, and is electrically connected to the first plate 18a.

On the second plate 18b, the electrostatic chuck ESC is provided. The electrostatic chuck ESC has a structure in which an electrode which is a conductive film is disposed between a pair of insulating layers or between a pair of insulating sheets. A direct current (DC) power supply 22 is electrically connected to the electrode of the electrostatic chuck ESC through a switch 23. When the wafer W is placed on the pedestal PD, the wafer W is in contact with the electrostatic chuck ESC. The rear surface (the surface opposite to the main surface FW) of the wafer W is in contact with the electrostatic chuck ESC. The electrostatic chuck ESC attracts the wafer W by an electrostatic force such as a Coulomb force generated by a DC voltage from the DC power supply 22. Therefore, the electrostatic chuck ESC is able to hold the wafer W.

On the peripheral edge portion of the second plate 18b, a focus ring FR is disposed to surround the edge of the wafer W and the electrostatic chuck ESC. The focus ring FR is provided in order to improve the uniformity of etching. The focus ring FR is made of a material appropriately selected depending on the material of the film to be etched, and may be made of, for example, quartz.

Inside the second plate 18b, a coolant flow path 24 is provided. The coolant flow path 24 constitutes a temperature adjustment mechanism. A coolant is supplied to the coolant flow path 24 from a chiller unit (not illustrated) provided outside the processing container 12 through a pipe 26a. The coolant supplied to the coolant flow path 24 is returned to the chiller unit through a pipe 26b. In this manner, the coolant is supplied to the coolant flow path 24 so as to circulate. By controlling the temperature of this coolant, the temperature of the wafer W supported by the electrostatic chuck ESC is capable of being controlled.

The plasma processing apparatus 10 is provided with a gas supply line 28. The gas supply line 28 supplies a heat transfer gas such as, for example, He gas, from the heat transfer gas supply mechanism to a space between the upper surface of the electrostatic chuck ESC and the rear surface of the wafer W.

The plasma processing apparatus 10 is provided with a temperature adjustment unit HT configured to adjust the temperature of the wafer W. The temperature adjustment unit HT is embedded in the electrostatic chuck ESC. A heater power supply HP is connected to the temperature adjustment unit HT. Since power is supplied from the heater power supply HP to the temperature adjustment unit HT, the temperature of the electrostatic chuck ESC is adjusted, and the temperature of the wafer W placed on the electrostatic chuck ESC is adjusted. The temperature adjustment unit HT may be embedded in the second plate 18b.

The temperature adjustment unit HT includes a plurality of heating elements configured to emit heat and a plurality of temperature sensors each configured to detect the ambient temperature of each of the plurality of heating elements. Each of the plurality of heating elements is provided for each of a plurality of regions on the main surface FW of the wafer W when the wafer W is placed and aligned on the electrostatic chuck ESC. When the wafer W is placed and aligned on the electrostatic chuck ESC, the controller Cnt recognizes the plurality of regions in association with the heating elements and temperature sensors, which correspond to respective regions on the main surface FW of the wafer W. The controller Cnt may identify the heating elements and temperature sensors, which correspond to respective regions, based on, for example, numbers such as, for example, numerals or characters for respective regions. The controller Cnt detects the temperature of one region using a temperature sensor provided in a portion corresponding to the one region, and perform temperature adjustment on the one region using a heating element provided in the portion corresponding to the one region. When the wafer W is placed on the electrostatic chuck ESC, the temperature detected by one temperature sensor is the same as the temperature of the region on the temperature sensor in the wafer W.

The plasma processing apparatus 10 includes an upper electrode 30. The upper electrode 30 is disposed above the pedestal PD so as to face the pedestal PD. The lower electrode LE and the upper electrode 30 are provided to be substantially parallel to each other, and form parallel plate electrodes. Between the upper electrode 30 and the lower electrode LE, a processing space Sp is provided in order to perform a plasma processing on the wafer W.

The upper electrode 30 is supported in the upper portion of the processing container 12 through an insulative shielding member 32. The insulative shielding member 32 includes an insulating material, and may include oxygen like, for example, quartz. The upper electrode 30 may include an electrode plate 34 and an electrode support 36. The electrode plate 34 faces the processing space Sp, and the electrode plate 34 is provided with a plurality of gas ejection holes 34a. In an embodiment, the electrode plate 34 contains silicon. In another embodiment, the electrode plate 34 may contain silicon oxide.

An electrode support 36 detachably supports the electrode plate 34, and may be made of a conductive material such as, for example, aluminum. The electrode support 36 may have a water-cooling structure. Inside the electrode support 36, a gas diffusion chamber 36a is provided. A plurality of gas flow holes 36b communicating with the gas ejection holes 34a extends downward from the gas diffusion chamber 36a. The electrode support 36 is provided with a gas inlet 36c configured to guide a processing gas to the gas diffusion chamber 36a, and a gas supply pipe 38 is connected to the gas inlet 36c.

To the gas supply pipe 38, a gas source group 40 is connected through a valve group 42 and a flow rate controller group 44. The gas source group 40 includes a plurality of gas sources. The plurality of gas sources will be described later.

The valve group 42 includes a plurality of valves. The flow rate controller group 44 includes a plurality of flow rate controllers such as, for example, mass flow controllers. Each of the plurality of gas sources of the gas source group 40 is connected to the gas supply pipe 38 through a corresponding valve in the valve group 42 and a corresponding flow controller in the flow controllers 44. Accordingly, the plasma processing apparatus 10 is capable of supplying a gas from at least one source selected among the plurality of gas sources of the gas source group 40 into the processing space Sp of the processing container 12 at an individually adjusted flow rate.

In the plasma processing apparatus 10, a deposit shield 46 is detachably provided along the inner wall of the processing container 12. The deposit shield 46 is also provided on the outer periphery of the support unit 14. The deposit shield 46 suppresses etching byproduct (deposit) from adhering to the processing container 12. The deposit shield 46 may be configured by coating, for example, an aluminum material with ceramics such as, for example, $Y_2O_3$. The deposit shield may have a material containing oxygen, like, for example, quartz, in addition to $Y_2O_3$.

On the bottom side of the processing container 12, an exhaust plate 48 is provided between the support unit 14 and the side wall of the processing container 12. The exhaust plate 48 may be configured by coating, for example, an aluminum material with ceramics such as, for example, $Y_2O_3$. An exhaust port 12e is provided below the exhaust plate 48 and in the processing container 12. An exhaust device 50 is connected to the exhaust port 12e through an exhaust pipe 52. The exhaust device 50 includes a vacuum pump such as, for example, a turbo molecular pump. The exhaust device 50 is capable of decompressing the space inside the processing container 12 to a desired degree of vacuum. A loading/unloading port 12g for a wafer W is provided in a side wall of the processing container 12. The loading/unloading port 12g is openable/closable by a gate valve 54.

The plasma processing apparatus 10 includes a first radio-frequency power supply 62 and a second radio-frequency power supply 64. The first radio-frequency power supply 62 is a power supply configured to generate first radio-frequency power for plasma generation, and generates radio-frequency power of 27 to 100 MHz, for example, 60 MHz in an example. In addition, the first radio-frequency power supply 62 has a pulse specification and is controllable with a frequency of 5 to 10 kHz and a duty of 50 to 100%. The first radio-frequency power supply 62 is connected to the upper electrode 30 through a matching device 66. The matching device 66 is a circuit configured to match the output impedance of the first radio-frequency power supply 62 with the input impedance on the load side (lower electrode LE side). The first radio-frequency power supply 62 may be connected to the lower electrode LE through the matching device 66.

The second radio-frequency power supply 64 is a power supply configured to generate second radio-frequency power for drawing ions into a wafer W, that is, radio-frequency bias power. The second radio-frequency power supply 64 generates radio-frequency bias power having a frequency within a range of, for example, 400 kHz to 40.68 MHz. In an example, the second radio-frequency power supply 64 generates radio-frequency bias power having a frequency of 13.56 MHz. In addition, the second radio-frequency power supply 64 has a pulse specification, and is controllable with, for example, a frequency of 5 to 40 kHz and a duty of 20 to 100%. The second radio-frequency power supply 64 is connected to the lower electrode LE through the matching device 68. The matching device 68 is a circuit configured to match the output impedance of the second radio-frequency power supply 64 with the input impedance on the load side (lower electrode LE side).

The plasma processing apparatus 10 further includes a power supply 70. The power supply 70 is connected to the upper electrode 30. The power supply 70 applies, to the upper electrode 30, a voltage for drawing positive ions existing in the processing space Sp into the electrode plate 34. In an example, the power supply 70 is a DC power supply that generates a negative DC voltage. When such a voltage is applied from the power supply 70 to the upper electrode 30, positive ions existing in the processing space Sp collide with the electrode plate 34. As a result, secondary electrons and/or silicon are emitted from the electrode plate 34.

The plasma processing apparatus 10 may further include a controller Cnt. The controller Cnt may be a controller such as, for example, a programmable computer device. The controller Cnt may control each unit of the plasma processing apparatus 10 according to a recipe-based program. For example, the controller Cnt selects a gas supplied from the gas source group 40 and controls the flow rate of the gas by a control signal. The controller Cnt controls exhaust of the exhaust device 50 by a control signal. The controller Cnt controls power supply from the first radio-frequency power supply 62 and the second radio-frequency power supply 64 by a control signal. The controller Cnt controls the voltage application from the power supply 70 by a control signal. The controller Cnt controls the power supply of the heater power supply HP by a control signal. The controller Cnt controls the coolant flow rate and the coolant temperature from the chiller unit by a control signal. Each step of the method MT may be executed by operating each unit of the plasma processing apparatus 10 through the control performed by the controller Cnt. In the storage unit of the controller Cnt, a computer program for executing the method MT and various data DT used for executing the method MT are readably stored.

Details of the plurality of gas sources will be described below. The plurality of gas sources includes an etching gas source of the ruthenium film L2. As an example, the plurality of gas sources may include an oxygen-containing gas source and a chlorine-containing gas source. The oxygen-containing gas is a gas containing oxygen atoms. An example of the oxygen-containing gas is oxygen gas. The chlorine-containing gas is a gas containing chlorine atoms. An example of the chlorine-containing gas is chlorine gas.

The plurality of gas sources includes a source of a gas for forming a protective film and a source of an etching gas for removing the protective film formed on the ruthenium film L2. The protective film is a film selected from a group consisting of a metal film, an oxide film, a nitride film, and an organic film.

An example of the oxide film is a film formed of silicon oxide. The gas for forming the silicon oxide film includes a gas for a precursor and a gas for supplying active species to the precursor. An example of the gas for the precursor is an aminosilane-based gas (e.g., monoaminosilane or trisilane) or a silicon halide gas (e.g., silicon tetrachloride ($SiCl_4$) gas, silicon tetrabromide ($SiBr_4$) gas, silicon tetrafluoride ($SiF_4$) Gas, or $SiH_2Cl_4$ gas). An example of the gas that supplies the active species to the precursor is an oxygen-containing gas. The plurality of gas sources may include, as a carrier gas or a purge gas, a rare gas such as, for example, helium (He) gas, neon (Ne) gas, argon (Ar) gas, xenon (Xe) gas, or krypton (Kr) gas, or nitrogen ($N_2$) gas. An example of the gas for etching the silicon oxide film includes carbon tetrafluoride ($CF_4$) gas and oxygen gas.

An example of the metal film is a film formed of tungsten. The gases for forming the tungsten film include a gas for a precursor and a gas for supplying active species to the precursor. An example of a precursor gas is tungsten halide gas, tungsten hexafluoride ($WF_6$) gas, or a tungsten hexachloride ($WCl_6$) gas. An example of the gas that supplies active species to the precursor is a hydrogen-containing gas. The plurality of gas sources may include a rare gas or a nitrogen gas as a source of a carrier gas or a purge gas. An example of the gas for etching the tungsten film includes carbon tetrafluoride gas and oxygen gas.

An example of the nitride film is a film formed of silicon nitride (SiN). The gas for forming the silicon nitride film includes a gas for precursor and a gas for supplying active species to the precursor. An example of the gas for precursor is an aminosilane-based gas or a silicon halide gas. An example of the gas that supplies active species to the precursor is ammonia ($NH_3$) gas. The plurality of gas sources may include a rare gas or a nitrogen gas as a source of a carrier gas or a purge gas. An example of a gas for etching the silicon nitride film includes carbon tetrafluoride gas and oxygen gas, or flon ($CHF_3$) gas and oxygen gas.

The gas for forming an organic film includes a first gas containing an electron-donating substituent and a second gas containing an electron-attracting substituent. The plurality of gas sources may include a rare gas or nitrogen gas as a source of a carrier gas or a purge gas. An example of a gas for etching the organic film is oxygen gas, oxygen gas and argon gas, or hydrogen gas and nitrogen gas.

(Details of Processing Method)

The details of the method MT will be described with reference to a case where the method MT is applied to the wafer W illustrated in FIG. 2 using the plasma processing apparatus 10 by way of an example. The method MT is executed in the state in which the wafer W is placed in the processing container 12 of the plasma processing apparatus 10, that is, in the processing space Sp. In the processing space Sp, the wafer W is placed on and held by the electrostatic chuck ESC.

As illustrated in FIG. 1, the method MT may include a first mask adjustment step ST1, an etching step ST2, and a second mask adjustment step ST3.

The first mask adjustment step ST1 is a step of forming a protective layer. The first mask adjustment step ST1 is executed in order to adjust the shape of a mask MK in the initial stage. Therefore, when the mask MK in the initial stage is sufficiently close to a design value, the first mask adjustment step ST1 may not be executed.

The first mask adjustment step ST1 includes steps S10 and S12. In step S10, the controller Cnt forms a protective film on the workpiece through an atomic layer deposition (ALD) method.

In step S10, the controller Cnt forms a film while adjusting the in-plane temperature distribution of the wafer W. First, the controller Cnt acquires the in-plane distribution data of the dimensions of the mask MK. The in-plane distribution data is data indicating the distribution of dimensions of the mask MK. More specifically, the in-plane distribution data is data in which the positions of the mask and the dimensions (shapes) thereof are associated with each other.

Figure 4A:
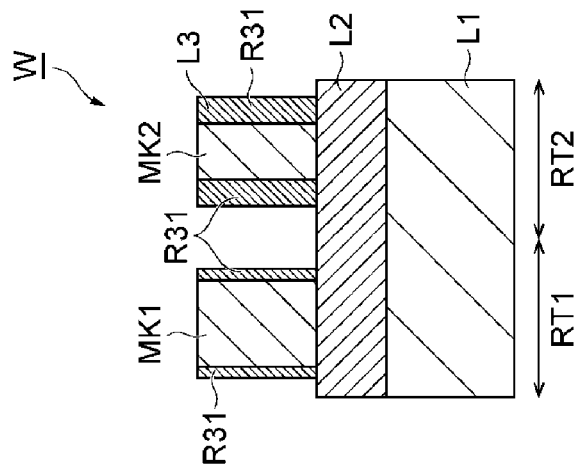
FIG. 4A is a view illustrating an exemplary workpiece in an initial state.

FIG. 4A illustrates an exemplary workpiece in the initial state. As illustrated in FIG. 4A, the length of a mask MK1 in the in-plane direction is DT1. The length of a mask MK2 in the in-plane direction is DT2. The design value of the length of the mask MK1 in the in-plane direction is assumed to be DT3 longer than DT1. The design value of the length of the mask MK2 in the in-plane direction is assumed to be DT4 longer than DT2. In such a case, it is necessary to adjust the shape of the mask MK.

Figure 15:
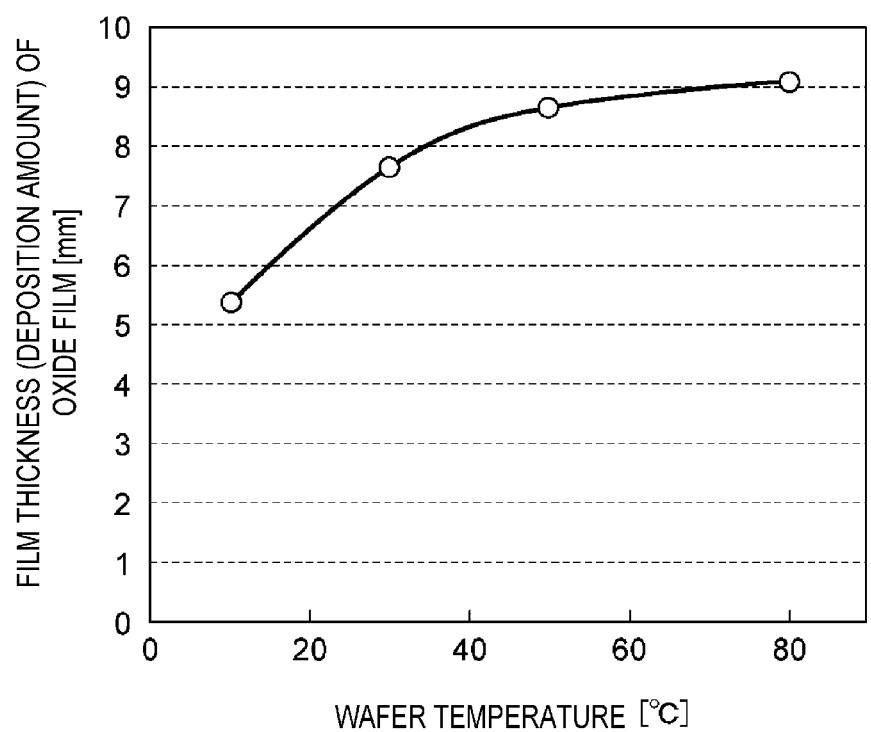
FIG. 15 is a view illustrating test results representing a relationship between a temperature of a wafer and a film thickness of an oxide film.
Figure 17:
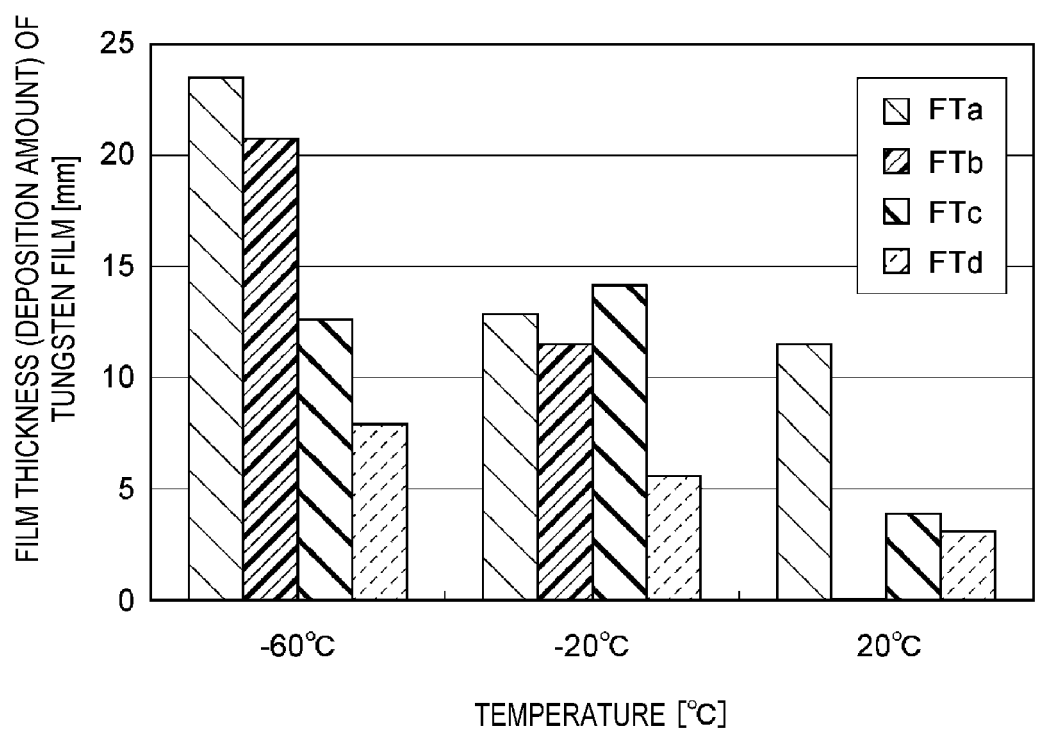
FIG. 17 is a graph illustrating film thickness measurement results of a tungsten film.

The controller Cnt determines a target temperature at each position on the wafer such that the dimension of the mask MK becomes a designed value, on the basis of the previously acquired relationship between the deposition amount of the protective film and the temperature of the wafer W and the in-plane distribution data of the dimensions of the mask MK. The deposition amount of the protective film formed through the atomic deposition method depends on the temperature of the wafer W. For example, when the protective film is an oxide film, as represented in FIG. 15 described later, the deposition amount increases as the temperature of the wafer W rises. For example, when the protective film is a metal film, as represented in FIG. 17 described later, the deposition amount decreases as the temperature of the wafer W rises. Similarly, the deposition amount has temperature dependency even in a nitride film and an organic film. Such a dependence relationship is acquired in advance in the plasma processing apparatus 10 or another apparatus, and stored in a storage unit of the controller Cnt. The controller Cnt determines the temperature of the wafer W on the basis of the previously acquired relationship between the deposition amount of the protective film and the temperature of the wafer W such that a deposition amount corresponding to a difference from a designed value is deposited.

Figure 4B:
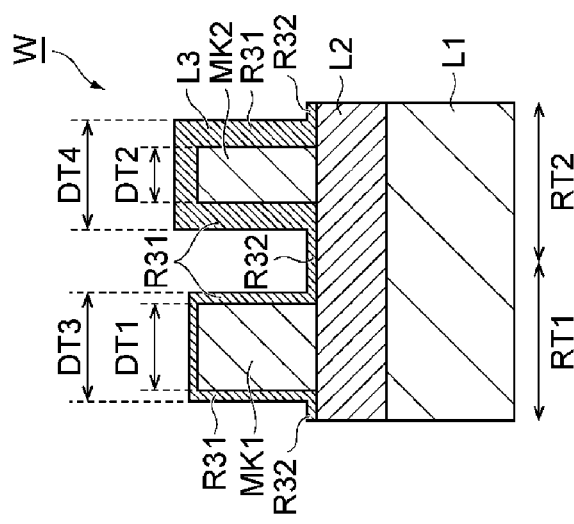
FIG. 4B is a view for explaining a protective film on the workpiece.

FIG. 4B is a view for explaining a protective film on a workpiece. As illustrated in FIG. 4B, the controller Cnt determines the temperature of an area RT1 on the wafer W corresponding to the mask MK1. The controller Cnt determines a first temperature at which a deposition amount corresponding to the difference between the length DT3 and the length DT1 is deposited based on the previously acquired relationship between the deposition amount of the protective film and the temperature of the wafer W. The first temperature is the target temperature of the region RT1. The controller Cnt determines the temperature of a region RT2 on the wafer W corresponding to the mask MK2. The controller Cnt determines a second temperature at which a deposition amount corresponding to the difference between the length DT4 and the length DT2 is deposited based on the previously acquired relationship between the deposition amount of the protective film and the temperature of the wafer W. The second temperature is the target temperature of the region RT2. The controller Cnt controls the temperature distribution of the wafer W such that the determined target temperature is acquired at each position on the wafer W. Specifically, the controller Cnt controls the temperature distribution of the wafer W by controlling the heater power supply HP and the temperature adjustment unit HT.

The controller Cnt causes the protective film to be deposited while controlling the temperature distribution. In the case where the protective film is an oxide film, a nitride film, or a metal film, the controller Cnt executes a plurality of cycles each including a step of supplying a precursor gas to the wafer W and a step of generating plasma. The step of supplying the precursor gas to the wafer W is carried out in order to deposit a precursor containing the raw material of the protective film on the wafer W. The step of generating the plasma is carried out in order to supply active species to the precursor on the wafer W.

The controller Cnt controls the flow rate controller group 44 such that the first gas for the precursor is supplied into the processing space Sp. Therefore, the molecules of the first gas adhere to the surface of the wafer W by chemical adsorption based on chemical bonding. Subsequently, the controller Cnt purges the processing space Sp. Specifically, the controller Cnt controls the exhaust device 50 to exhaust the first gas. The controller Cnt may control the flow rate controller group 44 such that an inert gas such as, for example, nitrogen gas or rare gas, is supplied to the processing space Sp as the purge gas. That is, the purge may be implemented in a vacuum state, or may be implemented by supplying the inert gas to the processing space Sp. As the processing space Sp is purged, molecules excessively adhering to the surface of the wafer W are removed, and a very thin precursor molecular layer is formed.

Subsequently, the controller Cnt generates the plasma of a second gas in order to supply active species to the precursor. The controller Cnt controls the flow rate controller group 44 to supply the second gas to the processing space Sp. Then, the controller Cnt controls the first radio-frequency power supply 62 and the second radio-frequency power supply 64 to supply radio-frequency power. In addition, the controller Cnt sets the pressure in the processing space Sp to a preset pressure by operating the exhaust device 50. In this way, the plasma of the second gas is generated in the processing space Sp. When the plasma of the second gas is generated, active species (e.g., radicals) are generated. The radicals are bonded to the precursor adsorbed on the surface of the wafer W to form a very thin molecular layer.

In the case where the protective film is an oxide film, an example of the first gas is an aminosilane-based gas or a silicon halide gas, and an example of the second gas is an oxygen-containing gas. In the case where the protective film is a metal film, an example of the first gas is a tungsten halide gas, a tungsten hexafluoride gas, or a tungsten hexachloride gas, and an example of the second gas is a hydrogen-containing gas. In the case where the protective film is a nitride film, an example of the first gas is an aminosilane-based gas or a silicon halide gas, and an example of the second gas is ammonia gas.

When the protective film is an organic film, film formation is performed without generating plasma. When the protective film is an organic film, a plurality of cycles each including a step of supplying a gas containing an electron-donating substituent and a step of supplying a gas containing an electron-attracting substituent are executed. A protective film which is a very thin molecular layer is formed through the polymerization reaction of a material of a gas containing an electron-donating substituent and a gas material containing an electron-attracting substituent.

As illustrated in FIG. 4B, the protective film L3 formed on the wafer W has a thickness corresponding to the temperature of the wafer W. By forming the protective film L3, the length in the in-plane direction of the mask MK1 is changed from DT1 to DT3. The length in the in-plane direction of the mask MK2 is changed from DT2 to DT4. The formed protective film L3 includes a first region R31 extending along the side wall surface of the mask and a second region R32 extending over the ruthenium film L2.

Figure 4C:
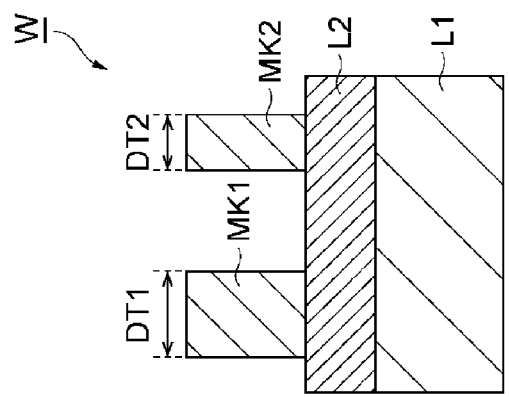
FIG. 4C is a view for explaining the removal of the protective film.

Subsequently, in step S12, the controller Cnt removes a portion of the protective film. FIG. 4C is a view for explaining the removal of the protective film. As illustrated in FIG. 4C, the controller Cnt etches the protective film L3 so as to remove the second region R32 while leaving the first region R31. The controller Cnt controls the flow rate controller group 44 to supply the etching gas to the processing space Sp. Then, the controller Cnt controls the first radio-frequency power supply 62 and the second radio-frequency power supply 64 to supply radio-frequency power. In addition, the controller Cnt sets the pressure in the processing space Sp to a preset pressure by operating the exhaust device 50. In this manner, the plasma of the etching gas is generated in the processing space Sp, and the second region R32 is removed by etching.

In the case where the protective film is an oxide film or a metal film, an example of the etching gas is carbon tetrafluoride ($CF_4$) gas and oxygen gas. In the case where the protective film is a nitride film, an example of the etching gas is carbon tetrafluoride gas and oxygen gas, or flon gas and oxygen gas. In the case where the protective film is an organic film, an example of the etching gas is oxygen gas, oxygen gas and argon gas, or hydrogen gas and nitrogen gas.

By executing the first mask adjustment step ST1, it is possible to arbitrarily control the shape of the mask MK. That is, it is also possible to uniformize the lengths of the mask MK 1 and the mask MK 2 in the in-plane direction. Therefore, it is possible to suppress variations in the in-plane direction shape of the ruthenium film due to the initial shape of the mask MK.

Subsequently, as illustrated in FIG. 1, the controller Cnt executes the etching step ST2 of the ruthenium film. The etching step ST2 includes step S14 (e.g., an example of the first step) and step S16 (an example of the second step).

In step S14, the controller Cnt etches the ruthenium film L2 through a plasma processing using an oxygen-containing gas. The plasma processing using an oxygen-containing gas is to process a wafer W using plasma generated by an oxygen-containing gas. The controller Cnt executes the plasma processing under predetermined etching conditions. The etching conditions include a target temperature and a target processing time. The target temperature is a preset temperature targeted for the wafer W. The target processing time is a preset time targeted for the plasma processing. The target temperature may be 100° C. or lower. A method of determining the target temperature and the target processing time will be described later. In step S14, the controller Cnt controls the heater power supply HP and the temperature controller HT such that the temperature of the wafer W becomes the target temperature. In step S14, the controller Cnt generates the plasma of oxygen gas in the processing container 12, that is, in the processing space Sp. The controller Cnt may apply radio-frequency bias for drawing-in of ions. The controller Cnt plasma-etches the wafer W during the target processing time.

In step S16, the controller Cnt etches the ruthenium film L2 through a plasma processing using a chlorine-containing gas. The plasma processing using a chlorine-containing gas is to process a wafer W using plasma generated by a chlorine-containing gas. The controller Cnt executes the plasma processing under predetermined etching conditions. The etching conditions include a target temperature and a target processing time. The target temperature may be 100° C. or lower. A method of determining the target temperature and the target processing time will be described later. In step S16, the controller Cnt controls the heater power supply HP and the temperature controller HT such that the temperature of the wafer W becomes the target temperature. In step S16, the controller Cnt generates the plasma of chlorine gas in the processing container 12, that is, in the processing space Sp. The controller Cnt may apply radio-frequency bias for drawing-in of ions. The controller Cnt plasma-etches the wafer W during the target processing time.

Figure 5A:
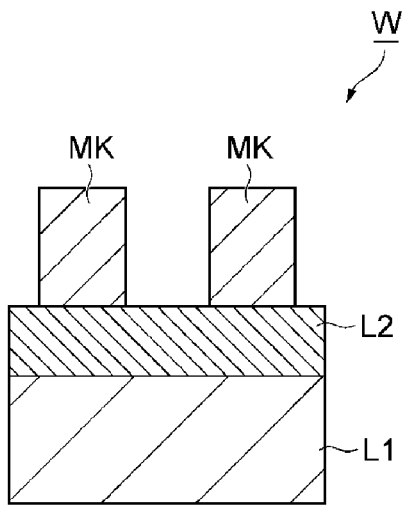
FIG. 5A is a view illustrating an exemplary workpiece provided for etching.
Figure 5B:
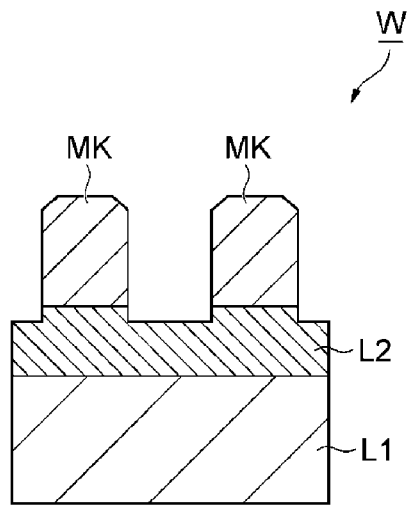
FIG. 5B is a view illustrating the exemplary workpiece which is etched.

FIG. 5A is a view illustrating an exemplary workpiece provided for etching. FIG. 5B is a view illustrating the exemplary workpiece which is etched. By executing etching step ST2, as illustrated in FIGS. 5A and 5B, the ruthenium film L2 of the wafer W is etched using the mask MK. As will be described later, steps S14 and S16 of the etching step ST2 are repeated until the target number of cycles is reached.

Subsequently, the controller Cnt determines the number of execution cycles in step S18. The number of execution cycles may be counted with step S14 and step S16 being considered as one set. As an example, when step S14 and step S16 are alternately executed once, the number of execution cycles is "1." As an example, when step S14 and step S16 are alternately executed twice, the number of execution cycles is "2."

In step S18, the controller Cnt determines whether or not the number of execution cycles is equal to a specified number of cycles. The specified number of cycles is a threshold value predetermined in order to determine the timing of forming a protective film. The specified number of cycles is predetermined depending on the shape change of the mask MK in the lateral direction. The shape change in the lateral direction of the mask MK may be measured in advance under an execution condition. The shape change of the mask MK in the lateral direction may be determined using a simulation. For example, when the number of execution cycles is X times, it is acquired in advance that the shape change of the mask MK in the lateral direction is Y. When the number of execution cycles is equal to the specified number of cycles (step S18: YES), the controller Cnt determines that it is timing to form a protective film. In this case, the controller Cnt forms the protective film in the second mask adjustment step ST3.

In the second mask adjustment step ST3, as in the first mask adjustment step ST1, the controller Cnt forms the protection film L3 and removes the second region R32 of the protection film L3 by etching. That is, the second mask adjustment step ST3 includes steps S20 and S22 corresponding to steps S10 and S12.

In step S20, the controller Cnt forms the protective film L3 so as to compensate for the shape change of the mask MK in the lateral direction caused due to the etching of the specified number of cycles. The film formation method is the same as the step S10, and the protective film L3 is formed by atomic deposition while adjusting the temperature of the wafer W. As an example, the controller Cnt determines, on the basis of a target deposition amount (corresponding to the shape change of the mask MK in the lateral direction) and a previously acquired relationship between the deposition amount of the protective film and the temperature of the wafer W, the target temperature at each position on the wafer W such that the dimension of the mask MK becomes a designed value.

The target deposition amount may be the amount predicted on the basis of the shape change of the mask MK in the lateral direction caused due to the etching of the designated number of cycles or may be the amount actually measured after the etching. In addition, the shape change of the mask MK in the lateral direction caused due to the etching of the designated number of cycles may be provided as in-plane distribution data of dimensions of the mask MK.

Figure 5C:
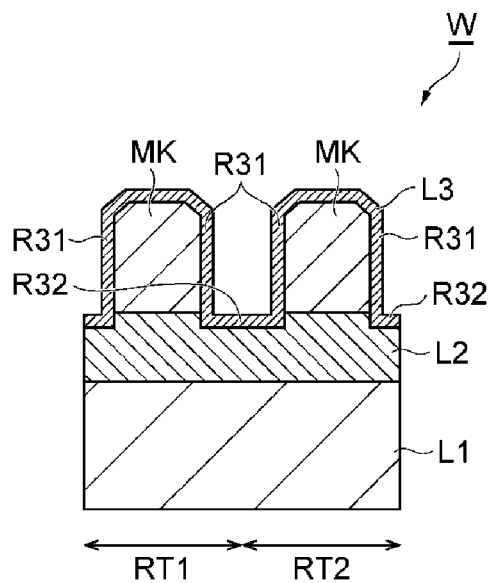
FIG. 5C is a view illustrating the exemplary workpiece on which a protective film is formed.

FIG. 5C is a view illustrating the exemplary workpiece on which a protective film is formed. By performing step S20, the protective film L3 is formed on the wafer W as illustrated in FIG. 5C.

Figure 5D:
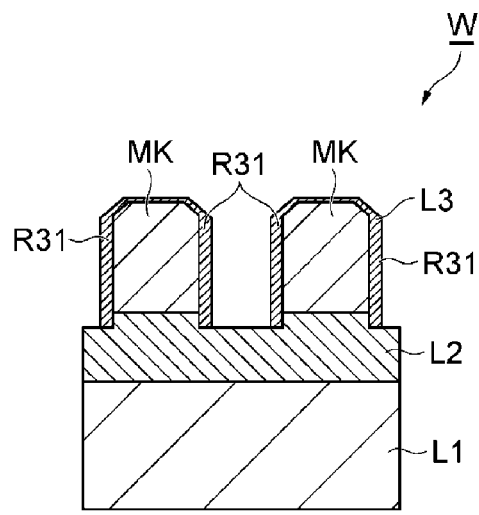
FIG. 5D is a view illustrating the exemplary workpiece in which a portion of the protective film is etched.

In the subsequent step S22, the controller Cnt removes a portion of the protective film. The removing method is the same as that in step S12, and is performed by etching. FIG. 5D is a view for explaining the removal of the protective film. As illustrated in FIG. 5D, the controller Cnt etches the protective film L3 so as to remove the second region R32 while leaving the first region R31.

When step S22 is terminated or when the number of execution cycles is not equal to the specified number cycles (step S18: NO), the controller Cnt determines in step S24 whether the number of execution cycles is equal to the preset target number of cycles.

When it is determined that the number of execution cycles is not equal to the preset target cycle number, the controller Cnt executes the processing again from step S14. When it is determined that the number of execution cycles is equal to the preset target number of cycles, the controller Cnt terminates the flow chart illustrated in FIG. 1. In this manner, according to the method MT, the shapes of the mask of the wafer W at the initial stage are adjusted in steps S10 and S12. Then, step S14 and step S16 are alternately executed until the target number of cycles is reached, and the ruthenium film L2 is etched. When step S14 and step S16 are executed for the specified number of cycles, step S20 and step S22 are executed, and the shape of the mask MK is adjusted.

(Etching Principle of Ruthenium Film)

Figure 6:
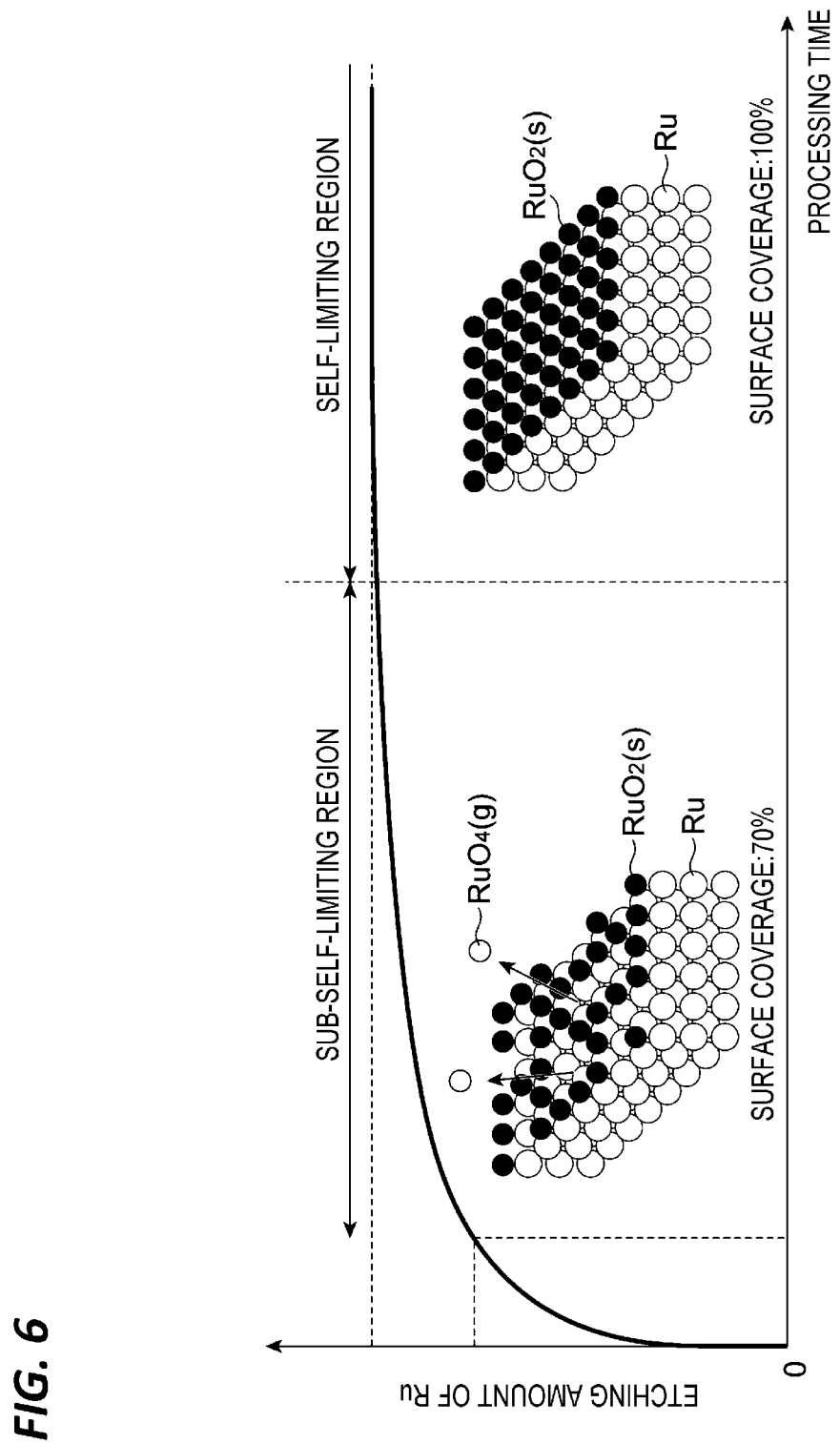
FIG. 6 is a graph illustrating a relationship between a processing time and an etching amount of Ru in plasma etching performed using an oxygen-containing gas.

First, the etching principle of step S14 will be described. FIG. 6 is a graph illustrating a relationship between a processing time and an etching amount of Ru in plasma etching performed using an oxygen-containing gas. In the graph illustrated in FIG. 6, the horizontal axis represents a processing time and the vertical axis represents an etching amount of Ru. As illustrated in FIG. 6, a volatile ruthenium oxide is produced on the surface of the ruthenium film by a chemical reaction with the plasma of the oxygen-containing gas. An example of the volatile oxide is $RuO_3$ (g) or $RuO_4$ (g). As the volatile oxide is produced, the surface of the ruthenium film is etched.

Further, on the surface of the ruthenium film, a nonvolatile ruthenium oxide is produced by a chemical reaction with the plasma of the oxygen-containing gas. An example of a nonvolatile oxide is $RuO_2$ (s). The nonvolatile oxide such as, for example, $RuO_2$ (s), covers the surface of the ruthenium film with the lapse of processing time. When the nonvolatile oxide is produced on the surface of the ruthenium film, a region where the volatile oxide is formed on the surface of the ruthenium film (a reaction site) decreases. As the reaction site decreases, the amount of nonvolatile oxide produced decreases. For example, in a processing time exceeding a processing time at which the surface coverage of the volatile oxide reaches 70%, the etching amount of Ru does not increase greatly. The surface coverage is the proportion of an occupied reaction site. At a processing time at which the surface coverage reaches 100%, the chemical reaction by the plasma does not progress significantly. When the chemical reaction by plasma is saturated, etching stop occurs, and even if the processing time is prolonged, the etching amount of Ru becomes substantially constant. In the following, the phenomenon in which the reaction site on the surface approaches 0% and the reaction does not proceed is called self-limiting. The processing time zone in which self-limiting is confirmed is called a self-limiting region. The phenomenon in which the progress speed of the reaction decreases before becoming perfect self-limiting is called sub-self-limiting. The processing time zone in which sub-self-limiting is confirmed is called a sub-self-limiting region. As an example, the sub-self-limiting region is a processing time in which the surface coverage is 70% to 100%.

Figure 7:
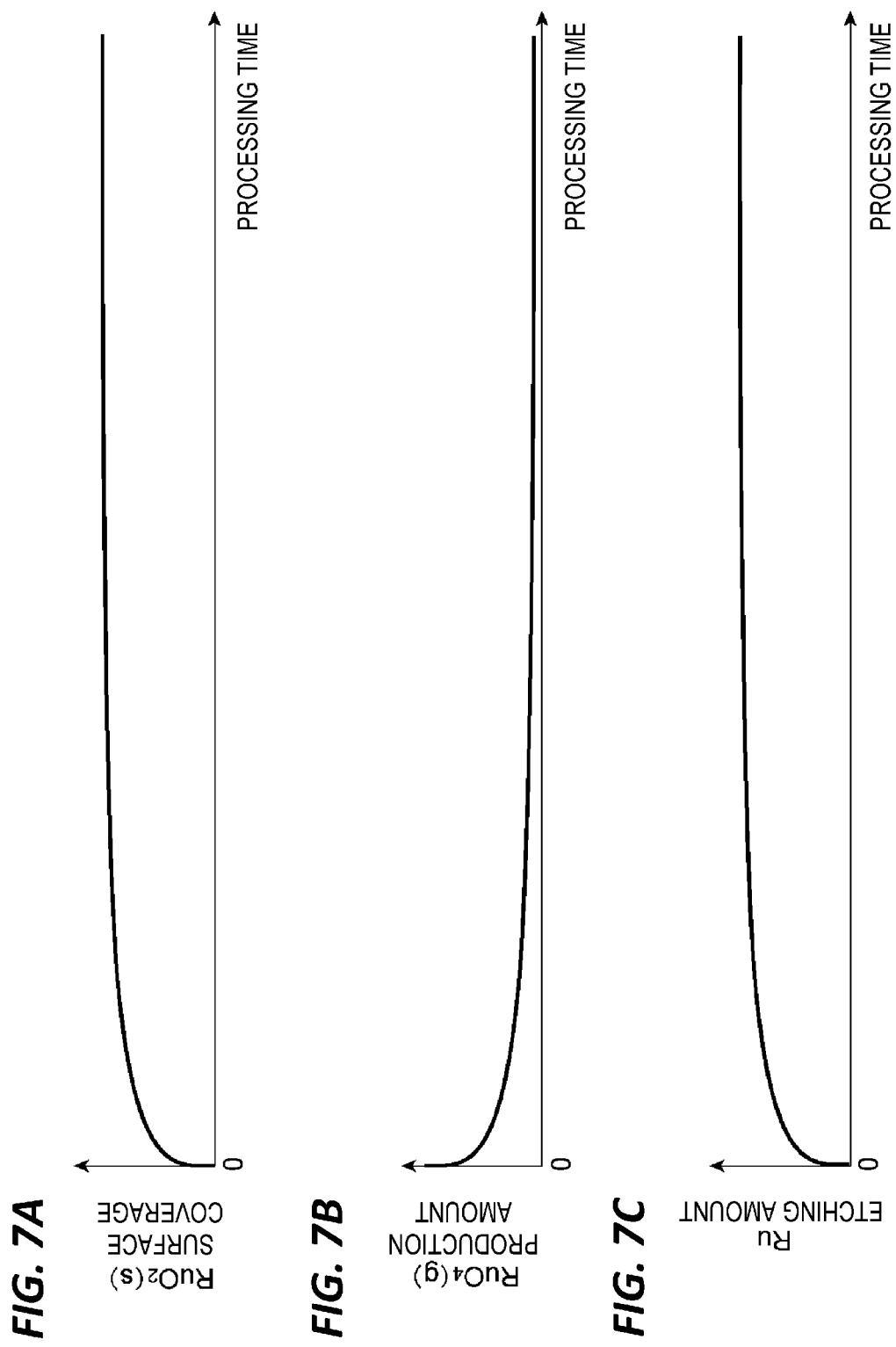
FIG. 7A is a graph illustrating a relationship between a processing time and a surface coverage of a nonvolatile oxide in plasma etching performed using an oxygen-containing gas.
FIG. 7B is a graph illustrating a relationship between a processing time and a generation amount of a volatile oxide in plasma etching performed using an oxygen-containing gas.
FIG. 7C is a graph illustrating a relationship between a processing time and an etching amount of Ru in plasma etching performed using an oxygen-containing gas.

FIGS. 7A to 7C are graphs representing the surface coverage of a nonvolatile oxide, the production amount of a volatile oxide, and the etching amount of Ru in comparison. FIG. 7A is a graph illustrating a relationship between a processing time and a surface coverage of a nonvolatile oxide in plasma etching performed using an oxygen-containing gas. FIG. 7B is a graph illustrating a relationship between a processing time and a generation amount of a volatile oxide in plasma etching performed using an oxygen-containing gas. FIG. 7C is a graph illustrating a relationship between a processing time and an etching amount of Ru in plasma etching performed using an oxygen-containing gas. In FIGS. 7A to 7C, the horizontal axis represents a processing time.

A nonvolatile oxide is produced on the surface of the ruthenium film by a chemical reaction such as, for example, $Ru+2O^* \rightarrow RuO_2$ (s) by the plasma of an oxygen-containing gas. At the same time, a volatile oxide is produced on the surface of the ruthenium film by a chemical reaction such as, for example, $Ru+4O^* \rightarrow RuO_4$ (g). As illustrated in FIG. 7A, the surface coverage of $RuO_2$ (s) increases with the lapse of the processing time. As illustrated in FIG. 7B, the production amount of $RuO_4$ (g) decreases as the surface coverage of $RuO_2$ (s) increases. As illustrated in FIG. 7C, the increase in the etching amount of Ru decreases as the production amount of $RuO_4$ (g) decreases. Thus, in plasma etching using an oxygen-containing gas, the amount that can be etched in a single step is limited.

Figure 8:
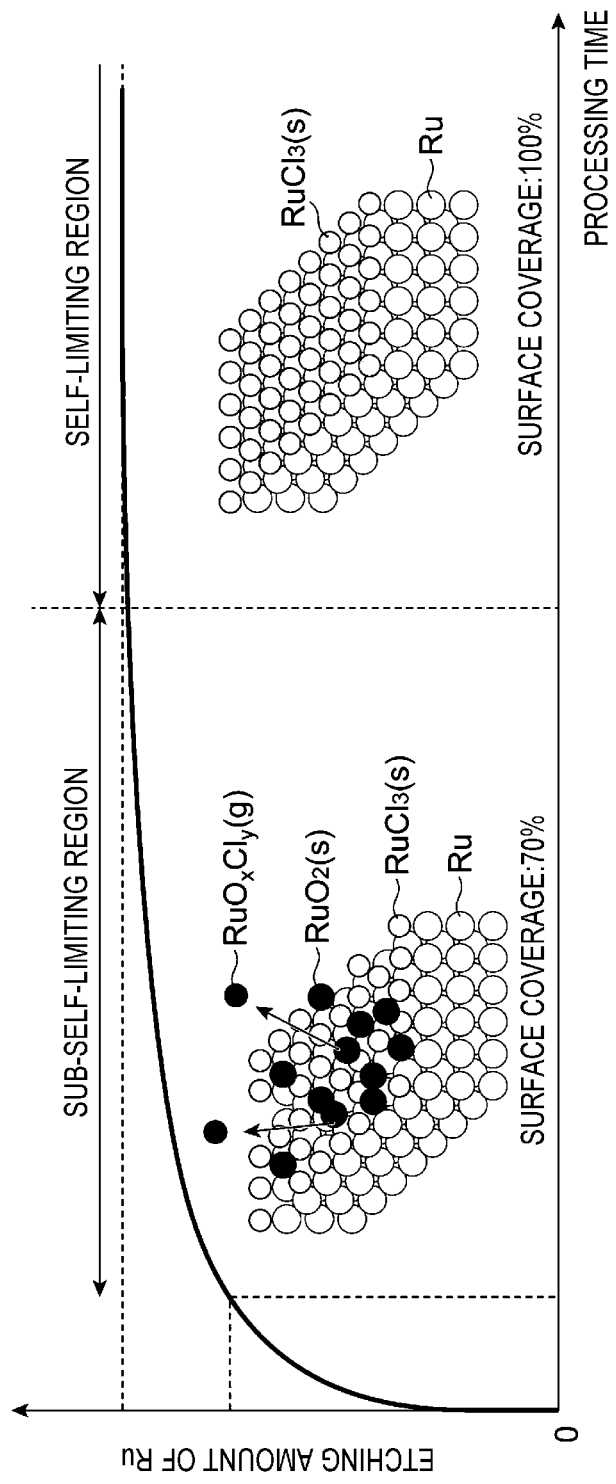
FIG. 8 is a graph illustrating a relationship between a processing time and an etching amount of Ru in plasma etching performed using a chlorine-containing gas.

Next, the etching principle of step S16 will be described. FIG. 8 is a graph illustrating a relationship between a processing time and an etching amount of Ru in plasma etching performed using a chlorine-containing gas. In the graph illustrated in FIG. 8, the horizontal axis represents a processing time and the vertical axis represents an etching amount of Ru. In the following description, the case where step S14 is executed before step S16 is exemplified. As illustrated in FIG. 8, a volatile ruthenium chloride is produced on the surface of the ruthenium film from a nonvolatile oxide by a chemical reaction with the plasma of a chlorine-containing gas. An example of the volatile chloride is $RuO_xCl_y$ (g). By the production of the volatile chloride such as, for example $RuO_xCl_y$ (g), the surface of the ruthenium film is etched.

The nonvolatile oxide decreases with the lapse of processing time because the nonvolatile oxide is turned into a volatile chloride and evaporates. Therefore, the etching amount of Ru decreases with the lapse of time. Further, on the surface of the ruthenium film, a nonvolatile ruthenium chloride is produced by a chemical reaction with the plasma of the chlorine-containing gas. An example of the nonvolatile chloride is $RuCl_3$ (s). The nonvolatile chloride such as, for example, $RuCl_3$ (s) covers the surface of the ruthenium film with the lapse of time. For example, in a processing time exceeding a processing time at which the surface coverage of the volatile chloride reaches 70%, the etching amount of Ru does not increase greatly. At a processing time at which the surface coverage reaches 100%, the chemical reaction by the plasma does not progress significantly. When the chemical reaction by plasma is saturated, etching stop occurs, and even if the processing time is prolonged, the etching amount of Ru becomes substantially constant. As described above, self-limiting and sub-self-limiting exist even in the plasma etching of chlorine-containing gas.

FIGS. 9A to 9C are graphs representing the surface coverage of a nonvolatile chloride, the production amount of a volatile chloride, and the etching amount of Ru in comparison. FIG. 9A is a graph illustrating a relationship between a processing time and a surface coverage of a nonvolatile chloride in plasma etching performed using a chlorine-containing gas. FIG. 9B is a graph illustrating a relationship between a processing time and a generation amount of a volatile chloride in plasma etching performed using a chlorine-containing gas. FIG. 9C is a graph illustrating a relationship between a processing time and an etching amount of Ru in plasma etching performed using a chlorine-containing gas. In FIGS. 9A to 9C, the horizontal axis represents a processing time.

By the chemical reaction of the plasma of a chlorine-containing gas, the nonvolatile oxide present on the surface of the ruthenium film is turned into a volatile chloride. At the same time, a nonvolatile chloride is produced on the surface of the ruthenium film by a chemical reaction of the plasma of the chlorine-containing gas. As illustrated in FIG. 9A, the surface coverage of $RuCl_3$ (s) increases with the lapse of the processing time. As illustrated in FIG. 9B, the production amount of $RuO_xCl_y$ (g) decreases according to the increase in the surface coverage of $RuCl_3$ (s) (the decrease in the surface coverage of $RuO_2$ (s)). As illustrated in FIG. 9C, the increase in the etching amount of Ru decreases as the production amount of $RuO_xCl_y$ (g) decreases. Thus, in plasma etching using a chlorine-containing gas, the amount that can be etched in a single step is limited.

(Surface Renewal by Alternate Implementation)

In the method MT, steps S14 and S16 are executed alternately. By alternately executing step S14 and step S16, an etching inhibiting factor generated in step S14 is removed in the next step S16. Similarly, the etching inhibiting factor generated in step S16 is removed in the next step S14.

FIGS. 10A to 10E are conceptual views for explaining the principle of the etching method. As illustrated in the state of FIG. 10A, when step S14 is performed, a nonvolatile oxide (e.g., $RuO_2$) and a volatile oxide (e.g., $RuO_4$) are produced by oxygen radicals. As the volatile oxide is produced, the ruthenium film is etched. Subsequently, as illustrated in the state of FIG. 10B, a nonvolatile oxide covers the surface of the ruthenium film, and thus the production amount of a volatile oxide decreases. As the production amount of the volatile oxide decreases, the etching amount of Ru decreases (self-limiting). Subsequently, when step S16 is performed, as illustrated in the state of FIG. 10C, a volatile chloride (e.g., $RuO_xCl_y$) is produced from the nonvolatile oxide by chlorine radicals. As the volatile chloride is produced, the ruthenium film is etched. Subsequently, as illustrated in the state FIG. 10D, the nonvolatile oxide is removed and, instead, the nonvolatile chloride (e.g., $RuCl_3$) covers the surface of the ruthenium film and the production amount of the volatile chloride decreases. As the production amount of the volatile chloride decreases, the etching amount of Ru decreases (self-limiting). When step S14 is performed again, the nonvolatile chloride is removed by oxygen radicals and returns to the state of FIG. 10A. In this manner, the surface of the ruthenium film is renewed by alternately executing step S14 and step S16.

(Determination of Target Temperature and Target Processing Time)

Since self-limiting exists in each of step S14 and step S16, the etching amount of RU per cycle in which step S14 and step S16 are performed as one set is a constant value over a certain processing time. The processing time until the etching amount of Ru per cycle is saturated depends on the control temperature of the ruthenium film. By previously acquiring the relationship between the etching amount per cycle, the controlled temperature of the ruthenium film, and the processing time of each step, the controller Cnt is able to determine the target temperature for achieving the target Ru etching amount per cycle and the target processing time. Hereinafter, the etching amount per cycle is also referred to as etch per cycle (EPC).

Figure 11:
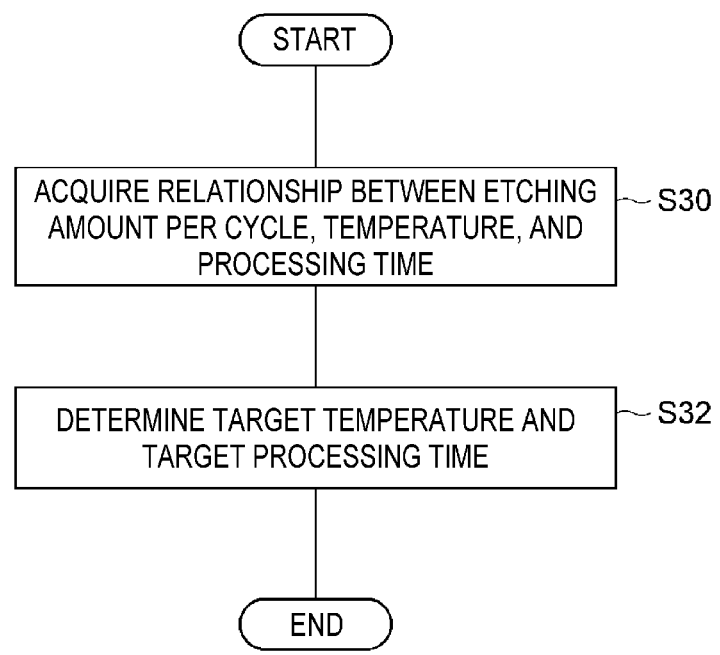
FIG. 11 is a flowchart illustrating an exemplary method of determining a target temperature and a target processing time.

FIG. 11 is a flowchart illustrating an exemplary method of determining a target temperature and a target processing time. The flowchart illustrated in FIG. 11 is executed by, for example, the controller Cnt.

Figure 14:
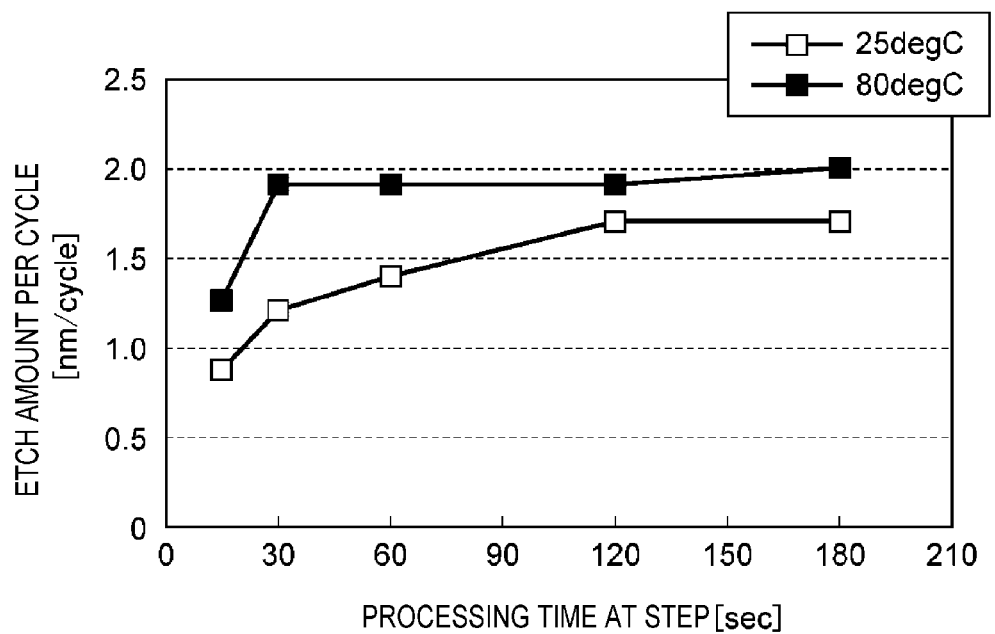
FIG. 14 is a view illustrating test results representing a relationship between a processing time of each step and an etching amount per cycle.

In step S30, the controller Cnt acquires a relationship between the EPC and the control temperature of the ruthenium film and the processing time of each step. For example, as illustrated in FIG. 14 to be described later, the controller Cnt acquires the relationship between the processing time of each step and the EPC for each control temperature. This relationship may be acquired in advance by, for example, the plasma processing apparatus 10, and may be stored in the storage unit of the controller Cnt. This relationship may be acquired in advance by, for example, another plasma processing apparatus, and may be stored in the storage unit of the controller Cnt. By referring to the storage unit, the controller Cnt acquires the relationship between the EPC and the control temperature of the ruthenium film and the processing time of each step. Through communication, the controller Cnt may acquire the relationship between the EPC and the control temperature of the ruthenium film and the processing time of each step.

In step S32, the controller Cnt determines the target temperature and the target processing time in steps S14 and S16 based on the acquired relationship. The controller Cnt determines the common target temperature and the target processing time as the target temperature and the target processing time in steps S14 and S16. The controller Cnt sets, for example, the target temperature to a temperature range corresponding to a previously acquired relationship. As an example, the controller Cnt sets the target temperature to 100° C. or lower. As an example, the controller Cnt may set the target temperature within the range of 25° C. to 80° C. The controller Cnt determines the processing time until the EPC is saturated based on the set target temperature and the above-described relationship. Then, the controller Cnt sets the target processing time to be equal to or longer than the processing time until the EPC is saturated. That is, the controller Cnt sets the target processing time to be equal to or longer than the processing time at which the reaction between ruthenium and oxygen is saturated, and also to be equal to or longer than the processing time at which the reaction between ruthenium and chlorine is saturated. The controller Cnt may independently determine each of the target temperature and the target processing time in steps S14 and S16. In this case, the controller Cnt sets the target processing time in step S14 to be equal to or longer than the processing time in which the reaction between ruthenium and oxygen is saturated, and sets the target processing time in step S16 to be equal to or longer than the processing time in which the reaction between ruthenium and chlorine is saturated. When step S32 is terminated, the flowchart illustrated in FIG. 11 is terminated.

By executing the flowchart illustrated in FIG. 11, in the method MT illustrated in FIG. 1, the ruthenium film is etched in the processing time in which the EPC is saturated (etching in the self-limiting region). The determination of the target temperature and the target processing time is not limited to the above-described method. For example, the target temperature and the target processing time may be determined based on the processing time zone (sub-self-limiting region) in which the EPC depends on the temperature.

Figure 12:
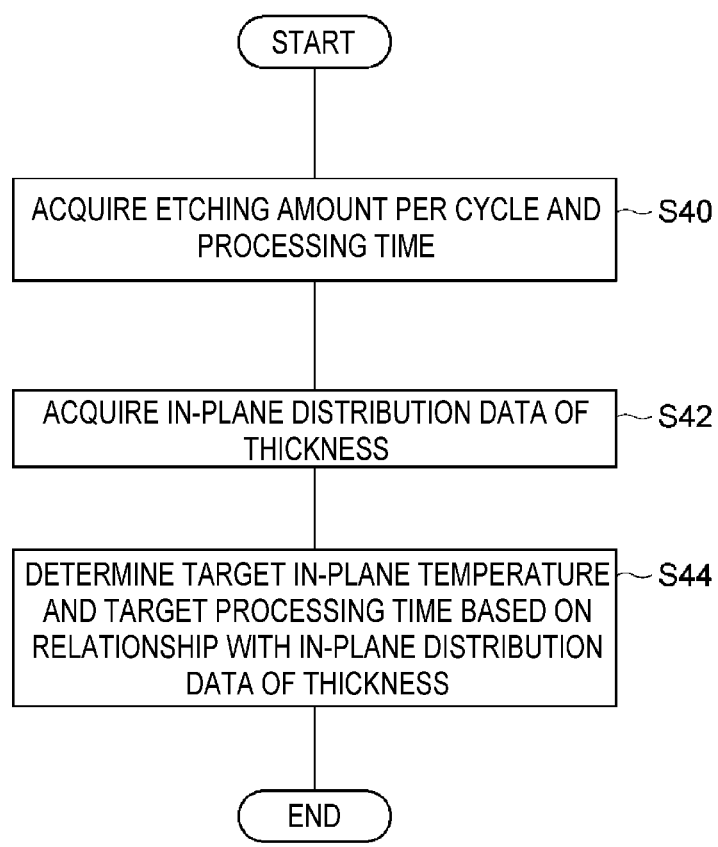
FIG. 12 is a flowchart illustrating another exemplary method of determining a target temperature and a target processing time.

FIG. 12 is a flowchart illustrating another exemplary method of determining a target temperature and a target processing time. The flowchart illustrated in FIG. 12 is executed by, for example, the controller Cnt.

In step S40, the controller Cnt acquires a relationship between the EPC and the control temperature of the ruthenium film and the processing time of each step. Step S40 is the same as step S30 in FIG. 11.

Figure 13A:
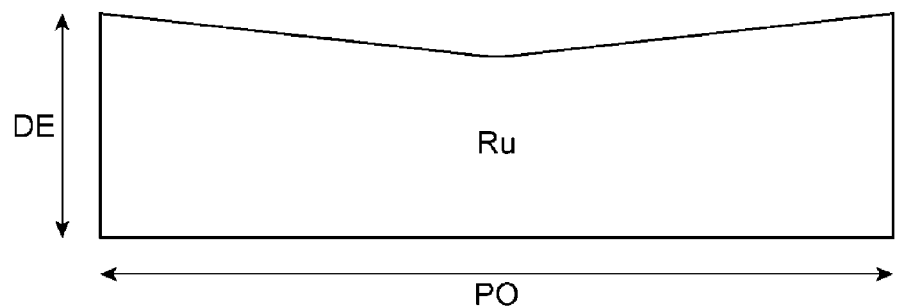
FIG. 13A is a view for explaining in-plane distribution data of a ruthenium film.

In step S42, the controller Cnt acquires in-plane distribution data of the thickness of the ruthenium film. The in-plane distribution data is data representing the distribution of the thickness for each position in the ruthenium film. FIG. 13A is a view for explaining in-plane distribution data of a ruthenium film. As illustrated in FIG. 13A, the thickness DE may differ at each position PO of the ruthenium film. The controller Cnt acquires data in which positions PO and thicknesses DE are associated as in-plane distribution data. The in-plane distribution data may be acquired in advance and stored in the storage unit of the controller Cnt. In this case, the controller Cnt acquires the in-plane distribution data by referring to the storage unit. The controller Cnt may acquire in-plane distribution data through communication.

Figure 13B:
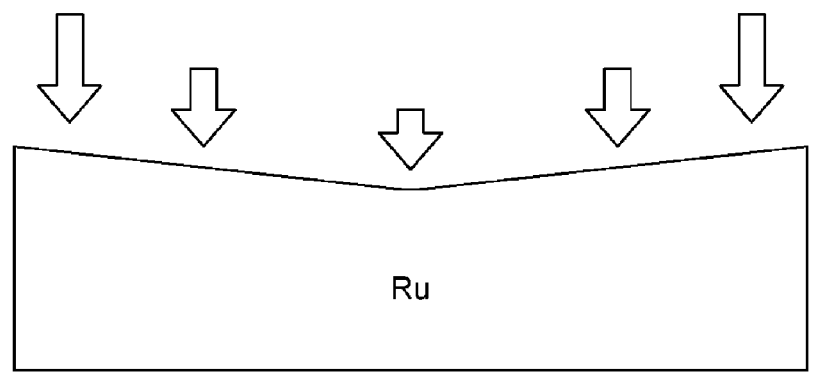
FIG. 13B is a view for explaining a target etching rate for each position of a ruthenium film.

In step S44, based on the in-plane distribution data of the thicknesses and the relationship acquired in step S40, the controller Cnt determines the target temperature and the target processing time of steps S14 and S16 so that the thickness of the ruthenium film becomes flat. As a specific example, the controller Cnt determines the target etching rate for each position of the ruthenium film such that the ruthenium film has a uniform thickness, based on the in-plane distribution data of the thickness. FIG. 13B is a view for explaining a target etching rate for each position of a ruthenium film. In FIG. 13B, the magnitude of the target etching rate is represented by lengths of arrows. As illustrated in FIG. 13B, for example, when an area in the vicinity of the edge is thicker than the center, the etching rate in the vicinity of the edge is determined to be larger than the etching rate in the center. As a result, the ruthenium film is able to have a uniform thickness. Next, the controller Cnt determines the target processing time. The controller Cnt determines the target processing time to be equal to or shorter than the processing time at which the reaction between ruthenium and oxygen is saturated, and also to be equal to or shorter than the processing time at which the reaction between ruthenium and chlorine is saturated. In this case, the etching amount is controlled in the sub-self-limiting region. Next, the controller Cnt determines the target temperature for each position to achieve the target etching rate for each position, based on the target processing time and the relationship acquired in step S40. The controller Cnt may independently determine each of the target temperature and the target processing time in steps S14 and S16. In this case, the controller Cnt sets the target processing time in step S14 to be equal to or shorter than the processing time in which the reaction between ruthenium and oxygen is saturated, and/or sets the target processing time in step S16 to be equal to or shorter than the processing time in which the reaction between ruthenium and chlorine is saturated. Therefore, in at least one of step S14 and step S16, the etching amount is controlled in the sub-self-limiting region. When step S44 is terminated, the flowchart illustrated in FIG. 12 is terminated.

Figure 13C:
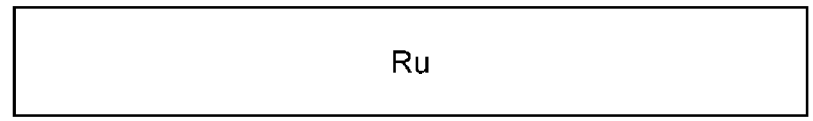
FIG. 13C is a view illustrating a ruthenium film etched based on in-plane distribution data.

By executing the flowchart illustrated in FIG. 12, in the method MT illustrated in FIG. 1, etching is performed a time equal to or shorter than in which EPC is saturated and in the state in which the in-plane temperature distribution of the ruthenium film is controlled (etching in the sub-self-limiting region). As a result, as shown in FIG. 13C, it is possible to perform etching with excellent in-plane uniformity.

(Summary of Embodiment)

According to the method MT, since the oxygen-containing gas and the chlorine-containing gas are alternately used for etching, it is possible to avoid that the etching rate depends on the plasma distribution of a mixed gas. Therefore, it is possible to suppress variation in etching rate. In addition, according to the method MT, the protective film L3 is formed on the surface of the mask MK and the ruthenium film L2 through an atomic layer deposition method. Then, the protective film L3 is etched so as to leave the first region R31. This makes it possible to compensate for the shape change of the mask MK in the lateral direction due to etching by the protective film L3. In addition, since the first region R31 of the protective film L3 is provided along the side wall surface of the mask MK, a stronger mask is provided for plasma etching of the ruthenium film L2. Therefore, the method MT is able to suppress a variation in the shape of the ruthenium film L2 in the in-plane direction. That is, according to the method MT, it is possible to arbitrarily control etching in the depth direction and the lateral direction of the ruthenium film L2.

The deposition amount of the protective film L3 realized by the deposition of a precursor and the reaction between the precursor and active species changes depending on the increase or decrease in the temperature of the wafer W. That is, using the temperature of the wafer W as a parameter, it is possible to change the deposition rate of the protective film L3 for each in-plane position. Therefore, according to the method MT, it is possible to not only suppress the variation in the shape of the ruthenium film L2 which is caused due to the shape change of the mask MK caused due to the etching, but also to suppress the variation in the shape of the ruthenium film L2 which is caused due to the initial shape of the mask MK.

When the processing time satisfies a predetermined condition, the etching amount per cycle varies depending on the increase or decrease of the temperature of the wafer W and the processing time of each step. The predetermined condition means a case where sets the target processing time in step S14 is set to be equal to or shorter than the processing time in which the reaction between ruthenium and oxygen is saturated, and/or the target processing time in step S16 is set to be equal to or shorter than the processing time in which the reaction between ruthenium and chlorine is saturated.

In this case, by determining the target processing time of each step within the above range, it is possible to change the etching rate of the ruthenium film L2 for each in-plane position using the temperature of the wafer W as a parameter. Therefore, according to the method MT, it is possible not only to keep the in-plane uniformity of the etching rate favorably, but also to reduce the in-plane uniformity of the residual film thickness after etching due to the nonuniform initial film thickness of the ruthenium film L2.

According to the method MT, by setting the target control time to the processing time in the self-limiting region at a certain target temperature, it is possible to generate etching stop in step S14 and step S16. Thus, according to the method MT, it is possible to control the etching amount per cycle to be constant.

According to the method MT, it is possible to change the etching rate for each in-plane position of the ruthenium film by controlling the in-plane temperature distribution of the ruthenium film based on the in-plane distribution data of the thickness. Therefore, according to the method MT, it is possible not only to keep the in-plane uniformity of the etching rate favorably, but also to suppress the deterioration the in-plane uniformity of the residual film thickness caused after etching due to the nonuniform initial film thickness of the ruthenium film.

Although various embodiments have been described above, various modifications can be configured without being limited to the embodiments described above. For example, the method MT may be performed using any type of plasma processing apparatus such as, for example, a plasma processing apparatus that excites a gas using surface waves such as, for example, microwaves of an inductively coupled plasma processing apparatus. In the method MT, either step S14 or step S16 may be executed first.

The method MT may include an exhaust step after step S14 and after step S16. In the exhaust step, the controller Cnt waits until the gas is exhausted from the processing space Sp. Therefore, it is possible to suppress mixing of an oxygen-containing gas and a chlorine-containing gas.

In the method MT, the first mask adjustment step ST1, the etching step ST2, and the second mask adjustment step ST3 may be executed in different apparatuses, respectively.

In the method MT, the in-plane distribution data of the dimensions of the mask MK and the in-plane distribution data of the ruthenium film L2 may be acquired in advance, or may be acquired during the execution of the method MT.

Hereinafter, various tests performed for evaluating the method MT will be described. The present disclosure is not limited to the following tests.

(Confirmation of Self-Limiting during Etching of Ruthenium Film)

The ruthenium film was etched by changing the processing time in steps S14 and S16 in the method MT. The conditions of the plasma are presented below.

<Step S14>
First radio frequency: 100 MHz, 50 W
Pressure of processing space Sp: 1.33 Pa (10 mTorr)
Processing gas: $O_2$
Flow rate of processing gas: 200 sccm
Controlled temperature of wafer W: 25° C., 80° C.
Processing time: 15 sec to 180 sec
<Step S16>
First radio frequency: 100 MHz, 50 W
Pressure of processing space Sp: 1.33 Pa (10 mTorr)
Processing gas: $Cl_2$
Flow rate of processing gas: 200 sccm
Controlled temperature of wafer W: 25° C., 80° C.
Processing time: 15 sec to 180 sec
<Number of Cycles>
5 times The etching amount per cycle was measured every processing time of step S14 and step S16. The processing time and the control temperature in step S14 are set to be the same as those in step S16. The results are represented in FIG. 14. FIG. 14 is a view illustrating test results representing a relationship between a processing time of each step and an etching amount per cycle. The horizontal axis represents the processing time [sec] of each process, and the vertical axis represents EPC [nm/cycle]. As illustrated in FIG. 14, at the control temperature of 25° C., when the processing time reached 120 sec or more, the etching amount per cycle became substantially constant and self-limiting was confirmed. At the control temperature of 80° C., when the processing time was reached 30 sec or more, the etching amount per cycle became substantially constant and self-limiting was confirmed. As described above, it was confirmed that there was self-limiting that causes the etching amount of the ruthenium film to be constant at the control temperature of 25° C. and 80° C. Furthermore, it was confirmed that the etching amount of the ruthenium film depends on the temperature in the processing time until self-limiting is caused, that is, in the sub-self-limiting region. As described above, it was confirmed that it is possible to change the etching amount within or less than the self-limiting range by changing the processing time and the control temperature in the sub-self-limiting region.

(Confirmation of Relationship Between Film Thickness of Protective Film and Temperature of Wafer)

(Oxide Film)

The processing temperature of the wafer W was set to 10° C. to 80° C., the protective film L3 was formed by an atomic layer deposition method, and the film thickness (deposition amount) was measured. The material of the protective film L3 was silicon oxide. The results are illustrated in FIG. 15. FIG. 15 is a view illustrating test results representing a relationship between a temperature of a wafer and a film thickness of an oxide film. The horizontal axis represents the temperature of the wafer W, and the vertical axis represents the film thickness of a silicon oxide film. As illustrated in FIG. 15, it was confirmed that as the temperature of the wafer W increased, the film thickness of the silicon oxide film increased. That is, according to the method MT, it was confirmed that it is possible to adjust the dimension of the mask MK in the in-plane direction by forming the protective film of an oxide film while adjusting the in-plane temperature of the wafer W.

(Metal Film)

Figure 16:
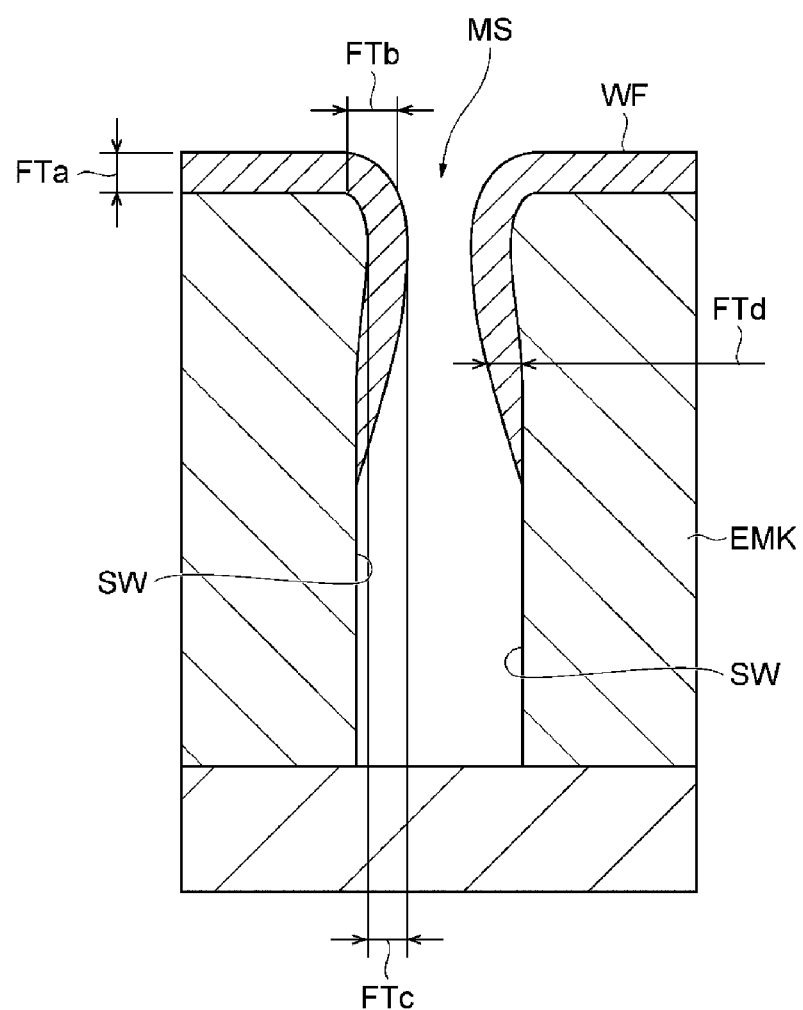
FIG. 16 is a view illustrating film thickness measurement places of a tungsten film.

The processing temperature of the wafer W was set to −60° C. to 20° C., the protective film L3 was formed through an atomic layer deposition method, and the film thickness (deposition amount) was measured. The material of the protective film L3 was tungsten. FIG. 16 is a view illustrating film thickness measurement places of a tungsten film. Each of the film thicknesses FTa, FTb, FTc, and FTd of a tungsten film WF illustrated in FIG. 16 was measured. The film thickness FTa is the film thickness of the tungsten film WF on the upper surface of the mask EMK. The film thickness FTb is the film thickness of the tungsten film WF in the lateral direction on the cross section including the upper surface of the mask EMK. The film thickness FTc is the film thickness of the tungsten film WF in the lateral direction on the cross section where the width of a space MS provided by the mask EMK and the tungsten film WF is the smallest. The film thickness FTd is the film thickness of the tungsten film WF on the cross section having a distance of 150 nm downward from the upper surface of the mask EMK. FIG. 17 is a graph illustrating film thickness measurement results of a tungsten film. In FIG. 17, the horizontal axis represents the temperature of a wafer W during film formation, and the vertical axis represents the film thickness of a tungsten film. As illustrated in FIG. 17, it was confirmed that the film thickness of the tungsten film became smaller as the temperature of the wafer W increased. That is, according to the method MT, it was confirmed that it is possible to adjust the dimension of the mask MK in the in-plane direction by forming the protective film of a metal film while adjusting the in-plane temperature of the wafer W.

As described above, there is provided a workpiece processing method capable of suppressing an in-plane variation in the etching rate of a ruthenium film and a variation in the shape of the ruthenium film in an in-plane direction.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of processing a workpiece, the method comprising:
    providing the workpiece including a ruthenium film and a mask on the ruthenium film;
    etching the ruthenium film through a plasma processing;
    forming a protective film on the workpiece through an atomic layer deposition method, the protective film including a first region extending along a side wall surface of the mask and a second region extending over the ruthenium film; and
    etching the protective film so as to remove the second region while leaving the first region,
    wherein the etching the ruthenium film includes:
        a first step of etching the ruthenium film through a plasma processing using an oxygen-containing gas; and
        a second step of etching the ruthenium film through a plasma processing using a chlorine-containing gas,
        wherein the first step and the second step are alternately performed,
    wherein the protective film is an organic film, and
    the forming the protective film includes performing a plurality of cycles each including:
        supplying a gas containing an electron-donating substituent; and
        supplying a gas containing an electron-attracting substituent.

2. The method of claim 1, wherein the protective film is a film selected from a group consisting of a metal film, an oxide film, a nitride film, and an organic film.

3. The method of claim 1, wherein the forming the protective film includes performing a plurality of cycles each including:
    supplying a precursor gas containing a raw material of the protective film to the workpiece so as to deposit a precursor containing the raw material of the protective film on the workpiece; and
    generating plasma in order to supply active species to the precursor on the workpiece.

4. The method of claim 1, further comprising:
    acquiring in-plane distribution data of a thickness of the ruthenium film; and determining a target temperature at each position on the workpiece such that the thickness of the ruthenium film becomes flat, based on a relationship between an etching amount per cycle in which the first step and the second step are included as one set and a temperature of the workpiece and a processing time of each step, which is acquired in advance, the in-plane distribution data of the thickness of the ruthenium film, and a target processing time of each step, wherein the target processing time in the first step is equal to or shorter than a processing time in which a reaction between ruthenium and oxygen is saturated, and/or the target processing time in the second step is equal to or shorter than a processing time in which a reaction between ruthenium and chlorine is saturated, and wherein, in the first step and the second step, a temperature distribution of the workpiece is controlled such that the determined target temperature at each position on the workpiece is acquired.

5. The method of claim 1, further comprising:

acquiring a relationship among an etching amount per cycle in which the first step and the second step are included as one set, a temperature of the workpiece, and a processing time of each step; and determining a target processing time of each step based on the relationship and a target temperature set within a temperature range corresponding to the relationship, wherein the target processing time in the first step is set to be equal to or longer than a processing time in which a reaction between ruthenium and oxygen is saturated, and/or the target processing time in the second step is set to be equal to or longer than a processing time in which a reaction between ruthenium and chlorine is saturated.

6. The method of claim 1, further comprising:

performing an exhaust processing after the first step and/or the second step.

7. The method of claim 1, further comprising:

after the etching the ruthenium film, determining whether or not the number of execution cycles in which the first step and the second step are included as one set is equal to a specified number of cycles that is a threshold value predetermined in order to determine a timing of forming the protective film.

8. The method of claim 7, wherein, when it is determined that the number of execution cycles is equal to the specified number of cycles in the determining whether or not the number of execution cycles is equal to the specified number of cycles, the forming the protective film and the etching the protective film are executed again.

9. The method of claim 8, further comprising:

when it is determined that the number of execution cycles is not equal to the specified number of cycles in the determining whether or not the number of execution cycles is equal to the specified number of cycles, or when the forming the protective film and the etching the protective film are terminated after the determining whether or not the number of execution cycles is equal to the specified number of cycles, determining whether or not the number of execution cycles is equal to a preset target number of cycles.

10. The method of claim 9, wherein, when it is determined that the number of execution cycles is equal to the specified number of cycles in the determining whether or not the number of execution cycles is equal to the specified number of cycles, the method is terminated, and when it is determined that the number of execution cycles is not equal to the specified number of cycles in the determining whether or not the number of execution cycles is equal to the specified number of cycles, the etching the ruthenium and the determining whether or not the number of execution cycles is equal to the specified number of cycles are executed again.

11. The method of claim 1, further comprising:

acquiring a relationship among an etching amount per cycle in which the first step and the second step are included as one set, a temperature of the workpiece, and a processing time of each step; and determining a target temperature and a target processing time of each step based on the relationship.

12. A method of processing a workpiece, the method comprising:

providing the workpiece including a ruthenium film and a mask on the ruthenium film;

etching the ruthenium film through a plasma processing;

forming a protective film on the workpiece through an atomic layer deposition method, the protective film including a first region extending along a side wall surface of the mask and a second region extending over the ruthenium film; and etching the protective film so as to remove the second region while leaving the first region, wherein the etching the ruthenium film includes:

a first step of etching the ruthenium film through a plasma processing using an oxygen-containing gas; and a second step of etching the ruthenium film through a plasma processing using a chlorine-containing gas, wherein the first step and the second step are alternately performed, wherein the method further comprises:

acquiring in-plane distribution data of dimensions of the mask; and determining a target temperature at each position on the workpiece such that the dimensions of the mask become designed values, based on a relationship between a deposition amount of the protective film and a temperature of the workpiece, which is acquired in advance, and the in-plane distribution data of the dimensions of the mask, and wherein, in the forming the protective film, a temperature distribution of the workpiece is controlled such that the determined target temperature at each position on the workpiece is acquired.

13. The method of claim 12, further comprising:

acquiring in-plane distribution data of a thickness of the ruthenium film; and determining a target temperature at each position on the workpiece such that the thickness of the ruthenium film becomes flat, based on a relationship between an etching amount per cycle in which the first step and the second step are included as one set and a temperature of the workpiece and a processing time of each step, which is acquired in advance, the in-plane distribution data of the thickness of the ruthenium film, and a target processing time of each step, wherein the target processing time in the first step is equal to or shorter than a processing time in which a reaction between ruthenium and oxygen is saturated, and/or the target processing time in the second step is equal to or shorter than a processing time in which a reaction between ruthenium and chlorine is saturated, and wherein, in the first step and the second step, a temperature distribution of the workpiece is controlled such that the determined target temperature at each position on the workpiece is acquired.

14. A method of processing a workpiece, the method comprising:
- providing the workpiece including a ruthenium film and a mask on the ruthenium film;
- etching the ruthenium film through a plasma processing;
- forming a protective film on the workpiece through an atomic layer deposition method, the protective film including a first region extending along a side wall surface of the mask and a second region extending over the ruthenium film; and
- etching the protective film so as to remove the second region while leaving the first region, wherein the etching the ruthenium film includes:
- a first step of etching the ruthenium film through a plasma processing using an oxygen-containing gas; and
- a second step of etching the ruthenium film through a plasma processing using a chlorine-containing gas, wherein the first step and the second step are alternately performed, and wherein the method further comprises:
- acquiring a relationship among an etching amount per cycle in which the first step and the second step are included as one set, temperature of the workpiece, and a processing time of each step;
- acquiring an in-plane distribution data of a thickness of the ruthenium film; and
- determining a target temperature and a target processing time of each step based on the relationship and the in-plane distribution data.

* * * * *